(12) United States Patent
Singh et al.

(10) Patent No.: US 10,734,489 B2
(45) Date of Patent: Aug. 4, 2020

(54) METHOD FOR FORMING SEMICONDUCTOR DEVICE STRUCTURE WITH METAL SILICIDE LAYER

(71) Applicant: Taiwan Semiconductor Manufacturing Co., Ltd., Hsinchu (TW)

(72) Inventors: Gulbagh Singh, Uttar Pradesh (IN); Cheng-Yeh Huang, Tainan (TW); Chin-Nan Chang, Tainan (TW); Chih-Ming Lee, Tainan (TW); Chi-Yen Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 83 days.

(21) Appl. No.: 16/179,165

(22) Filed: Nov. 2, 2018

(65) Prior Publication Data

US 2020/0044035 A1 Feb. 6, 2020

Related U.S. Application Data

(60) Provisional application No. 62/712,388, filed on Jul. 31, 2018.

(51) Int. Cl.
*H01L 29/40* (2006.01)
*H01L 21/762* (2006.01)
(Continued)

(52) U.S. Cl.
CPC ...... *H01L 29/401* (2013.01); *H01L 21/26513* (2013.01); *H01L 21/324* (2013.01);
(Continued)

(58) Field of Classification Search
None
See application file for complete search history.

(56) References Cited

U.S. PATENT DOCUMENTS 6,998,319 B2 * 2/2006 Tanaka ............ H01L 21/26586
257/E21.654
8,536,036 B2 * 9/2013 Beyer ............. H01L 21/823807
257/369

(Continued)

*Primary Examiner* — David E Graybill
(74) *Attorney, Agent, or Firm* — Birch, Stewart, Kolasch & Birch, LLP

(57) ABSTRACT

A method for forming a semiconductor device structure is provided. The method includes providing a semiconductor substrate. The method includes forming an isolation structure in the semiconductor substrate. The isolation structure surrounds a first active region and a second active region of the semiconductor substrate. The method includes forming a semiconductor strip structure over the semiconductor substrate. The semiconductor strip structure extends across the first active region, the second active region, and the isolation structure between the first active region and the second active region, the semiconductor strip structure has a P-type doped region, an N-type doped region, and a spacing region. The method includes performing an implantation process over the spacing region. The method includes forming a metal silicide layer over the semiconductor strip structure to cover the P-type doped region, the N-type doped region, and the spacing region.

20 Claims, 23 Drawing Sheets

(51) Int. Cl.
*H01L 21/768* (2006.01)
*H01L 21/324* (2006.01)
*H01L 29/45* (2006.01)
*H01L 21/265* (2006.01)

(52) U.S. Cl.
CPC .. *H01L 21/76202* (2013.01); *H01L 21/76224* (2013.01); *H01L 21/76895* (2013.01); *H01L 29/456* (2013.01)

(56) References Cited

U.S. PATENT DOCUMENTS

| | | | |
|---|---|---|---|
| 9,502,499 B2* | 11/2016 | Liu | H01L 29/785 |
| 9,831,130 B2* | 11/2017 | Lo | H01L 27/088 |
| 2004/0235255 A1* | 11/2004 | Tanaka | H01L 21/26586 |
| | | | 438/302 |
| 2008/0171414 A1* | 7/2008 | Kim | H01L 21/823835 |
| | | | 438/221 |
| 2008/0237734 A1* | 10/2008 | Hung | H01L 21/823807 |
| | | | 257/374 |
| 2010/0025771 A1* | 2/2010 | Hoentschel | H01L 21/26506 |
| | | | 257/369 |
| 2010/0123198 A1* | 5/2010 | Kim | H01L 21/26506 |
| | | | 257/377 |
| 2010/0148275 A1* | 6/2010 | Sato | H01L 21/823807 |
| | | | 257/369 |
| 2011/0156153 A1* | 6/2011 | Beyer | H01L 21/823807 |
| | | | 257/369 |
| 2013/0221444 A1* | 8/2013 | Igarashi | H01L 21/823412 |
| | | | 257/368 |
| 2016/0240609 A1* | 8/2016 | Liu | H01L 29/785 |
| 2017/0110457 A1* | 4/2017 | Ji | H01L 29/7842 |
| 2017/0278756 A1* | 9/2017 | Lo | H01L 27/088 |

* cited by examiner

METHOD FOR FORMING SEMICONDUCTOR DEVICE STRUCTURE WITH METAL SILICIDE LAYER

PRIORITY CLAIM AND CROSS-REFERENCE

This application claims the benefit of U.S. Provisional Application No. 62/712,388, filed on Jul. 31, 2018, and entitled "METHOD FOR FORMING SEMICONDUCTOR DEVICE STRUCTURE WITH METAL SILICIDE LAYER", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes (e.g., fabrication processes of a metal silicide layer) continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1M-1 are cross-sectional views illustrating the semiconductor device structure along a sectional line A-A' in FIGS. 1A-1M, in accordance with some embodiments.

FIGS. 1H-2 to 1M-2 are cross-sectional views illustrating the semiconductor device structure along a sectional line B-B' in FIGS. 1H-1M, in accordance with some embodiments.

FIGS. 1H-3 to 1M-3 are cross-sectional views illustrating the semiconductor device structure along a sectional line C-C' in FIGS. 1H-1M, in accordance with some embodiments.

FIGS. 2A-1 to 2B-1 are cross-sectional views illustrating the semiconductor device structure along a sectional line A-A' in FIGS. 2A-2B, in accordance with some embodiments.

FIGS. 2A-2 to 2B-2 are cross-sectional views illustrating the semiconductor device structure along a sectional line B-B' in FIGS. 2A-2B, in accordance with some embodiments.

FIGS. 2A-3 to 2B-3 are cross-sectional views illustrating the semiconductor device structure along a sectional line C-C' in FIGS. 2A-2B, in accordance with some embodiments.

DETAILED DESCRIPTION

Figure 1A:
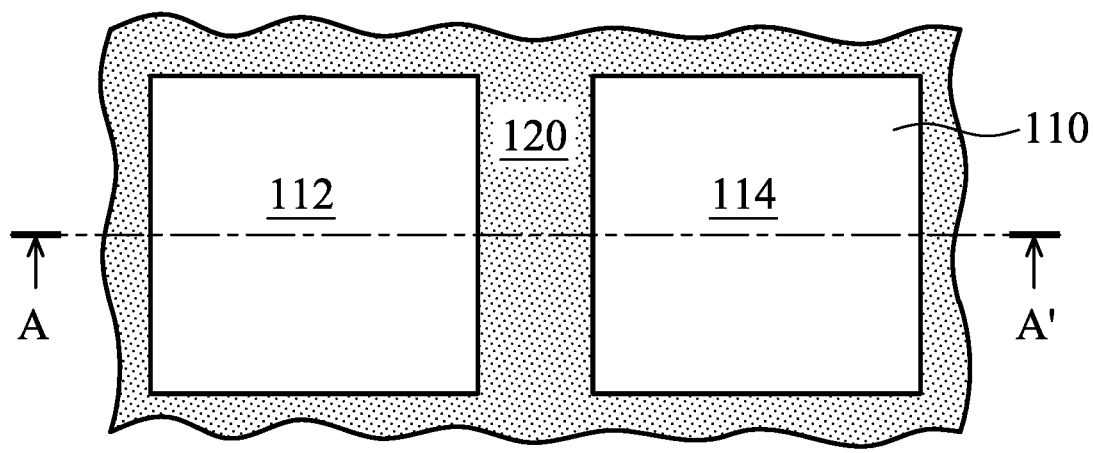
FIGS. 1A-1M are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A:
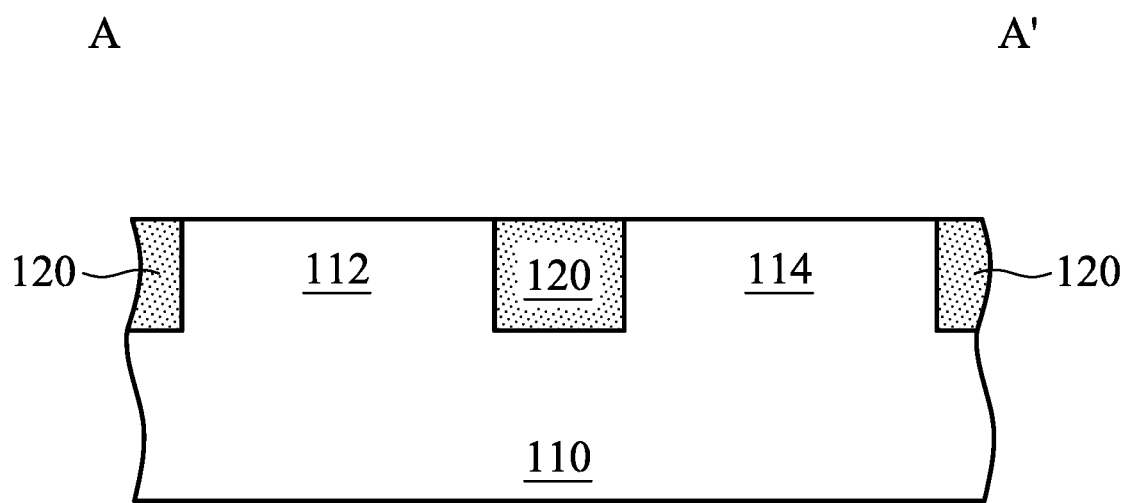

FIGS. 1A-1M are top views of various stages of a process for forming a semiconductor device structure, in accordance with some embodiments. FIGS. 1A-1 to 1M-1 are cross-sectional views illustrating the semiconductor device structure along a sectional line A-A' in FIGS. 1A-1M, in accordance with some embodiments. FIGS. 1H-2 to 1M-2 are cross-sectional views illustrating the semiconductor device structure along a sectional line B-B' in FIGS. 1H-1M, in accordance with some embodiments. FIGS. 1H-3 to 1M-3 are cross-sectional views illustrating the semiconductor device structure along a sectional line C-C' in FIGS. 1H-1M, in accordance with some embodiments.

As shown in FIGS. 1A and 1A-1, a semiconductor substrate 110 is provided. In some embodiments, electronic elements (not shown) are formed on or in the semiconductor substrate 110. The electronic elements include active elements (e.g. transistors, diodes, or the like) and/or passive elements (e.g. resistors, capacitors, inductors, or the like).

The semiconductor substrate 110 may be a semiconductor wafer (such as a silicon wafer) or a portion of a semiconductor wafer. In some embodiments, the semiconductor substrate 110 is made of an elementary semiconductor material including silicon or germanium in a single crystal, polycrystal, or amorphous structure.

In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

As shown in FIGS. 1A and 1A-1, an isolation structure 120 is formed in the semiconductor substrate 110 to define various active regions 112 and 114 of the semiconductor substrate 110, and to electrically isolate neighboring devices (e.g. transistors) from one another. The isolation structure 120 surrounds the active regions 112 and 114, in accordance with some embodiments.

The isolation structure 120 may be made of a dielectric material, such as silicon oxide, silicon nitride, silicon oxynitride, fluoride-doped silicate glass (FSG), a low-K dielectric material, other suitable materials, or combinations thereof. The isolation structure 120 may be formed by using an isolation technology, such as local oxidation of semiconductor (LOCOS), shallow trench isolation (STI), or the like.

In some embodiments, the formation of the isolation structure 120 includes patterning the semiconductor substrate 110 by a photolithography process, etching a trench in the semiconductor substrate 110 (for example, by using a dry etching process, a wet etching process, or a plasma etching process, or a combination thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

Figure 1B:
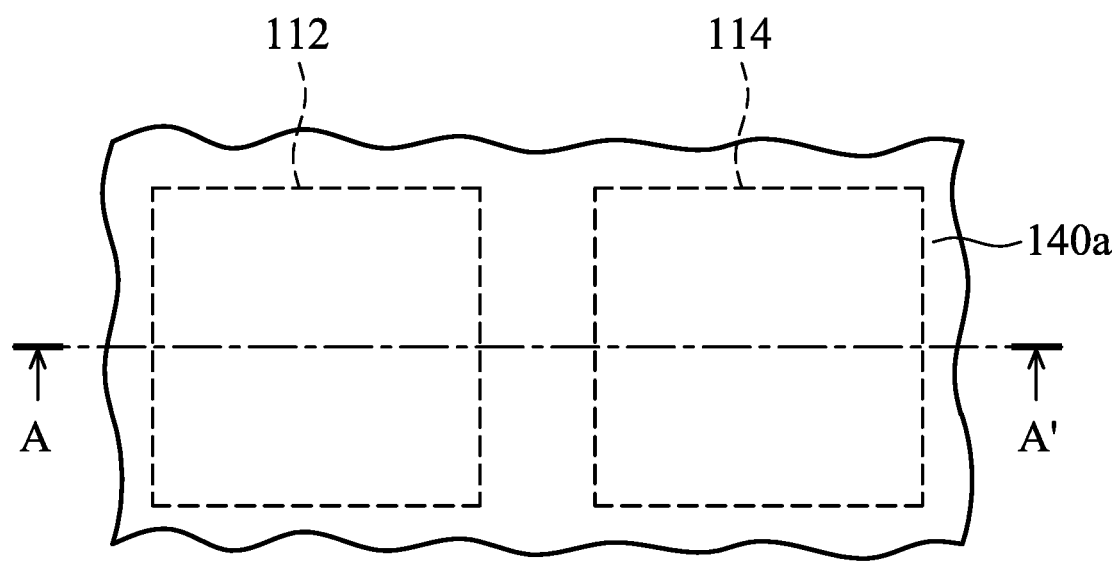
Figures 1, 1B:
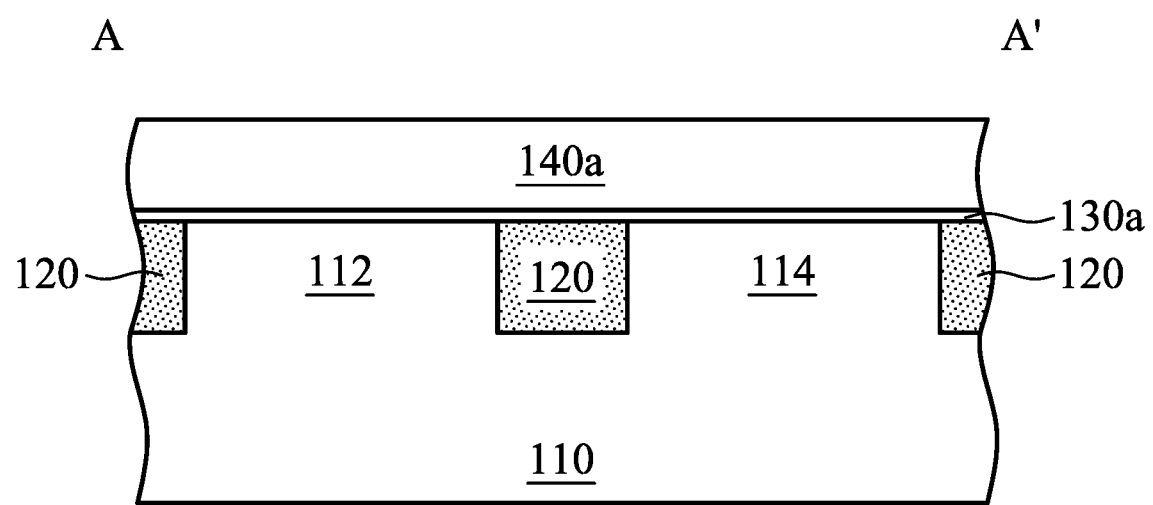

As shown in FIGS. 1B and 1B-1, a gate dielectric material layer 130a is formed over the semiconductor substrate 110, in accordance with some embodiments. The gate dielectric material layer 130a is made of silicon oxide, silicon oxynitride, a high dielectric constant material (high-k material), or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof, in accordance with some embodiments.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The gate dielectric material layer 130a is formed using a chemical vapor deposition (CVD) process, an atomic layer deposition (ALD) process, a physical vapor deposition (PVD) process, or a sputtering process, in accordance with some embodiments.

As shown in FIGS. 1B and 1B-1, a gate material layer 140a is formed over the gate dielectric material layer 130a, in accordance with some embodiments. The gate material layer 140a is made of polysilicon or other suitable semiconductor materials, in accordance with some embodiments. The gate material layer 140a is formed using a chemical vapor deposition process, in accordance with some embodiments.

Figure 1C:
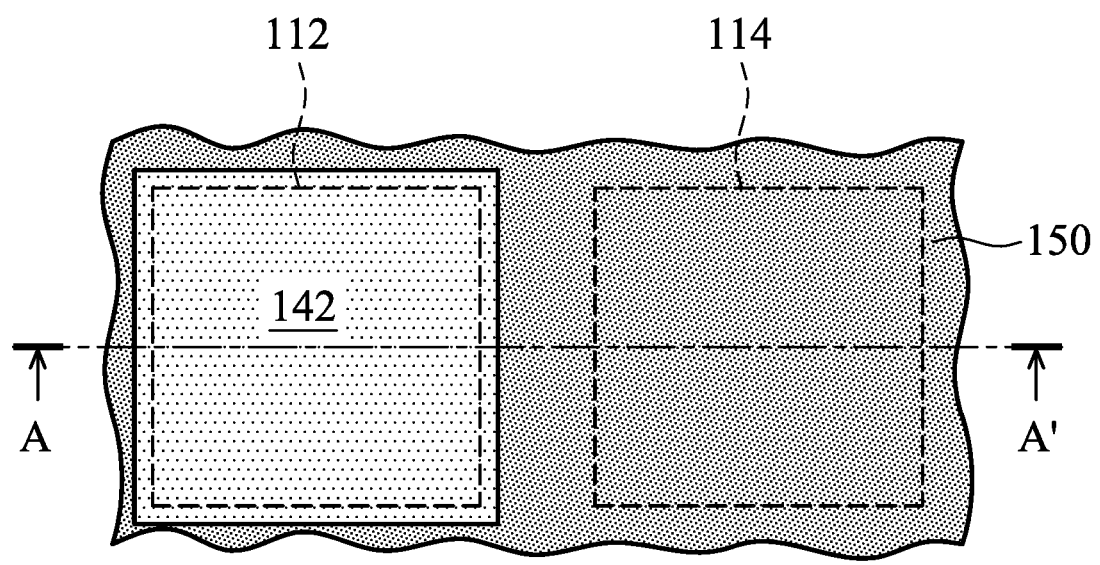
Figures 1, 1C:
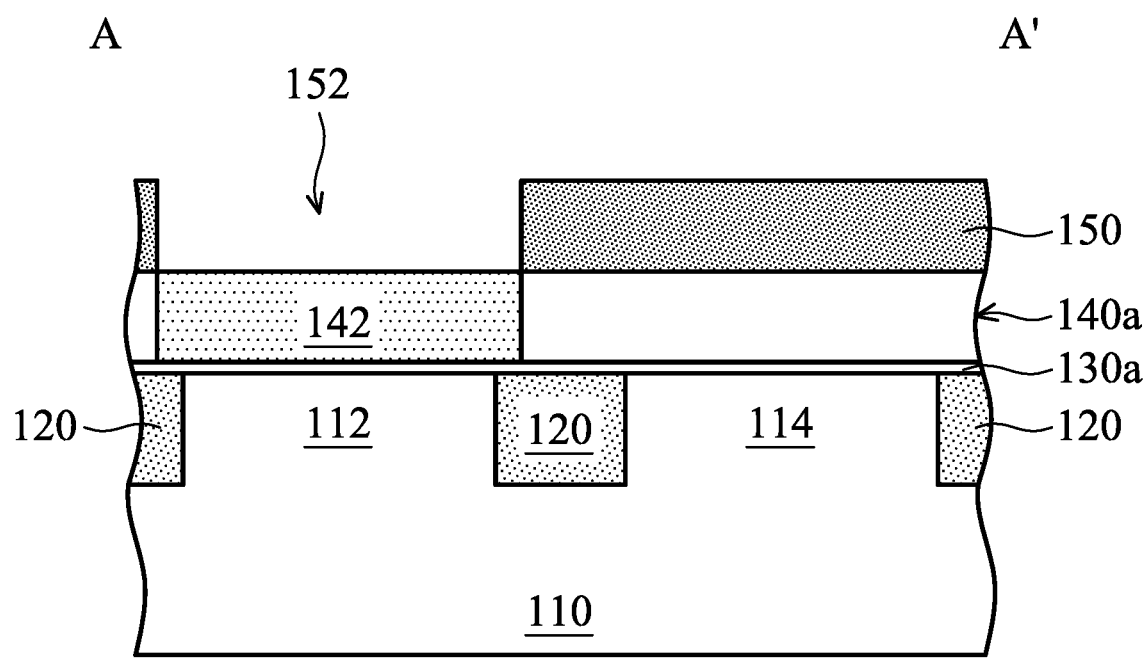

As shown in FIGS. 1C and 1C-1, a mask layer 150 is formed over the gate material layer 140a, in accordance with some embodiments. The mask layer 150 is made of a photoresist material or another suitable material, which is different from the material of the gate material layer 140a, in accordance with some embodiments. The mask layer 150 has an opening 152, in accordance with some embodiments. The opening 152 exposes a portion of the gate material layer 140a over the active region 112 and the isolation structure 120, in accordance with some embodiments.

As shown in FIGS. 1C and 1C-1, an implantation process is performed to implant P-type dopants into the portion of the gate material layer 140a under the opening 152 so as to form a P-type doped region 142 in the gate material layer 140a, in accordance with some embodiments.

The P-type doped region 142 is over the active region 112 and the isolation structure 120, in accordance with some embodiments. The P-type dopants include boron (B), aluminum (Al), gallium (Ga), indium (In), or thallium (Tl), in accordance with some embodiments. The implantation process includes an ion implantation process, in accordance with some embodiments.

Figure 1D:
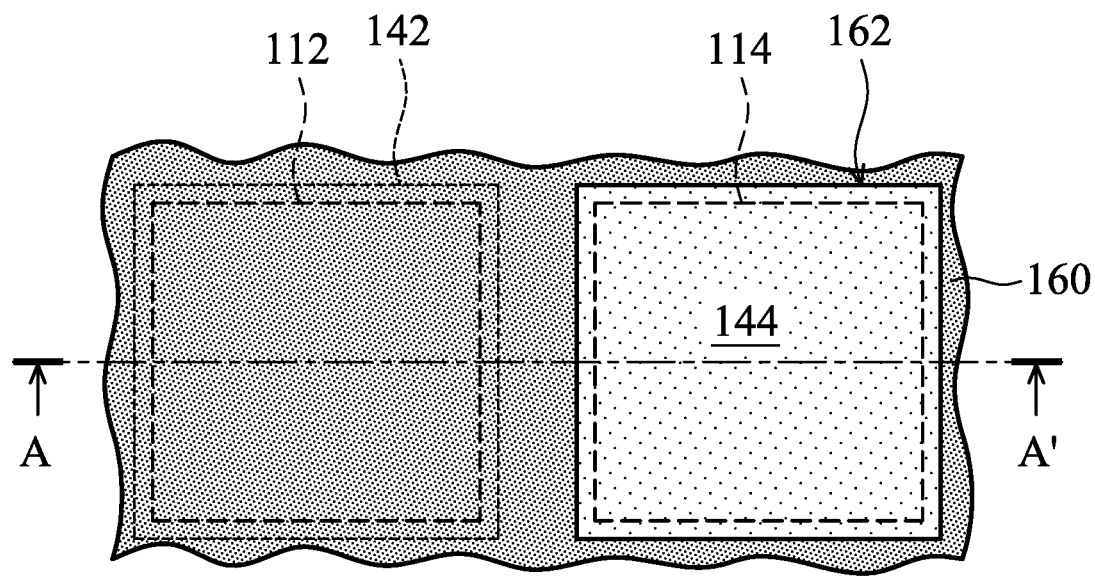
Figures 1, 1D:
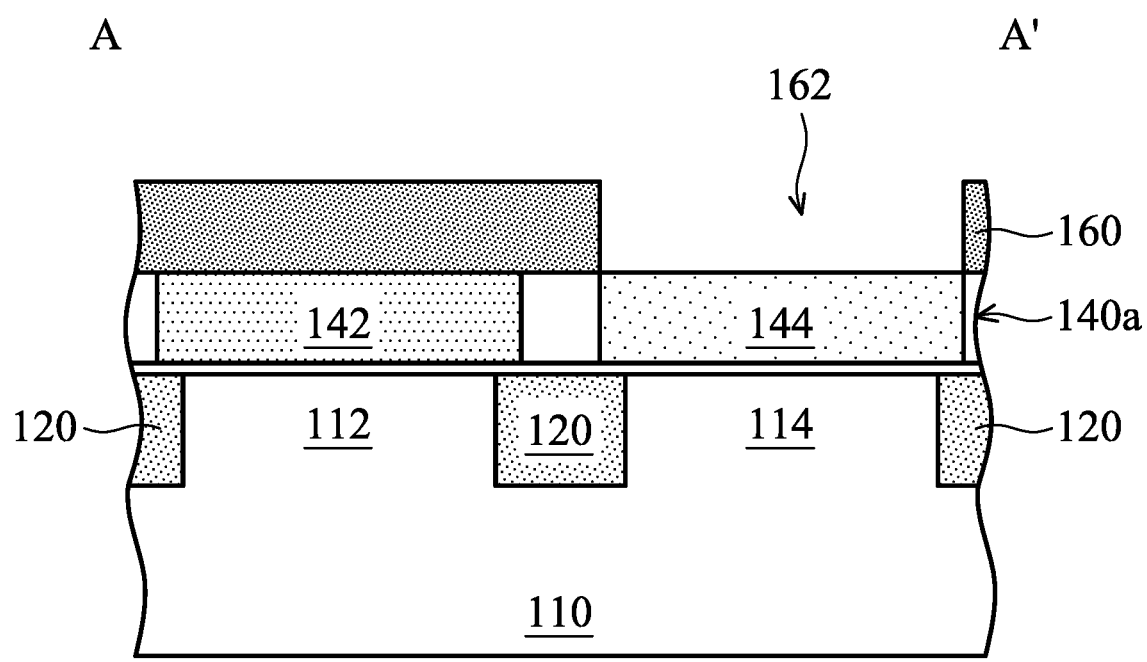

As shown in FIGS. 1D and 1D-1, the mask layer 150 is removed, in accordance with some embodiments. As shown in FIGS. 1D and 1D-1, a mask layer 160 is formed over the gate material layer 140a, in accordance with some embodiments. The mask layer 160 is made of a photoresist material or another suitable material, which is different from the material of the gate material layer 140a, in accordance with some embodiments. The mask layer 160 has an opening 162, in accordance with some embodiments. The opening 162 exposes a portion of the gate material layer 140a over the active region 114 and the isolation structure 120, in accordance with some embodiments.

As shown in FIGS. 1D and 1D-1, an implantation process is performed to implant N-type dopants into the portion of the gate material layer 140a under the opening 162 so as to form an N-type doped region 144 in the gate material layer 140a, in accordance with some embodiments.

The N-type doped region 144 is over the active region 114 and the isolation structure 120, in accordance with some embodiments. The N-type dopants include nitrogen (N), phosphorous (P), arsenic (As), tellurium (Te), or bismuth (Bi), in accordance with some embodiments. The implantation process includes an ion implantation process, in accordance with some embodiments.

Figure 1E:
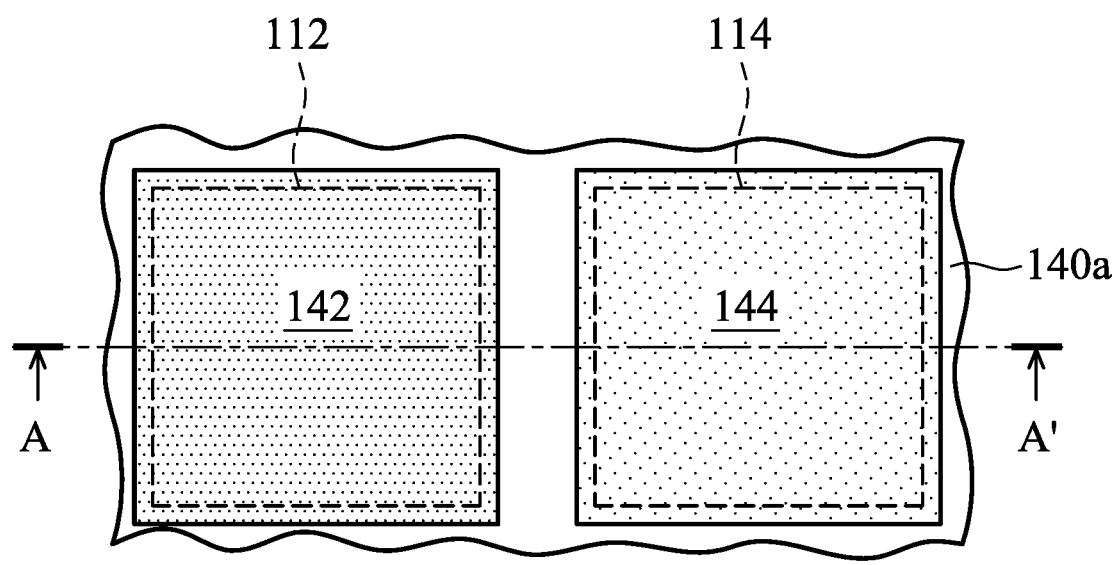
Figures 1, 1E:
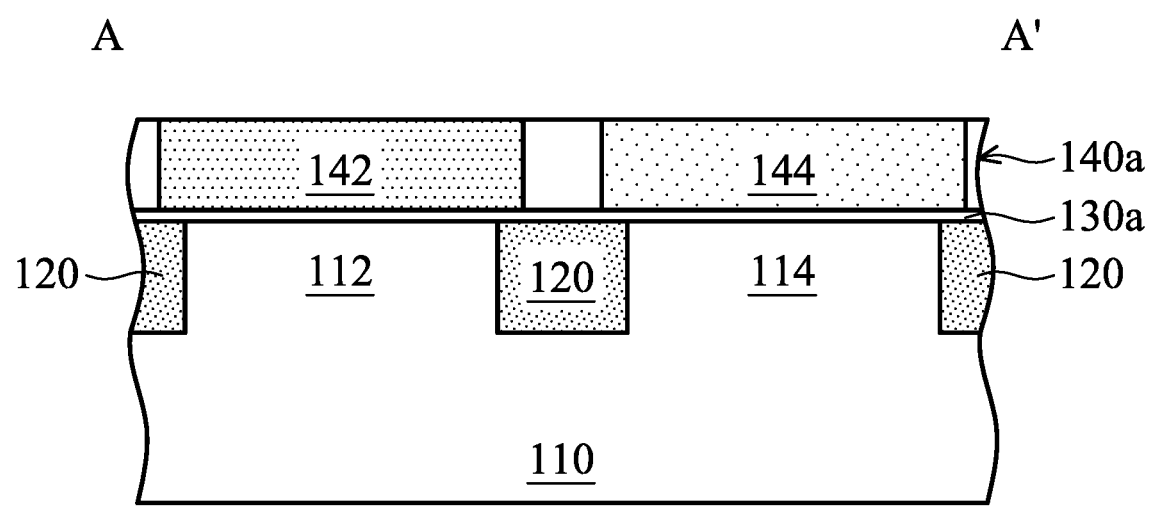
Figure 1F:
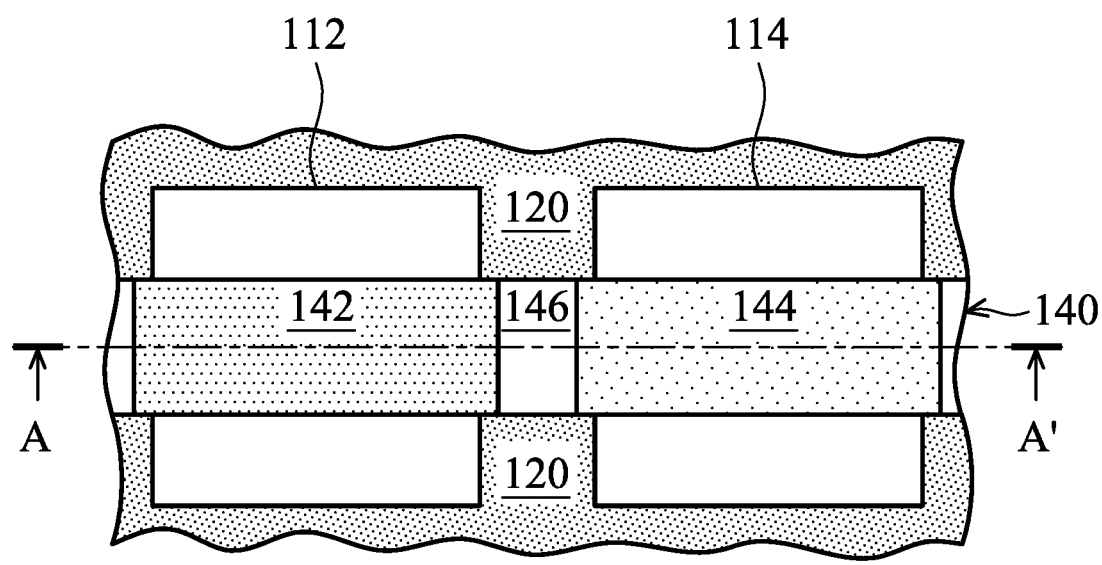
Figures 1, 1F:
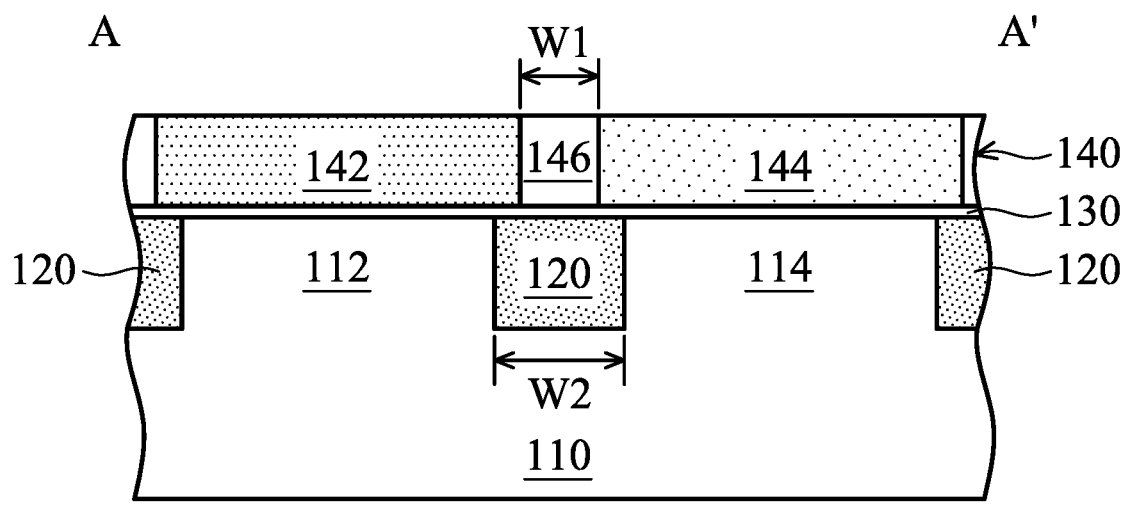

As shown in FIGS. 1E and 1E-1, the mask layer 160 is removed, in accordance with some embodiments. As shown in FIGS. 1F and 1F-1, portions of the gate material layer 140a and the gate dielectric material layer 130a thereunder are removed to form a semiconductor strip structure 140 and a gate dielectric layer 130 thereunder, in accordance with some embodiments.

The semiconductor strip structure 140 and the gate dielectric layer 130 continuously extend across the active regions 112 and 114 and the isolation structure 120 between the active regions 112 and 114, in accordance with some embodiments. The semiconductor strip structure 140 has the P-type doped region 142, the N-type doped region 144, and a spacing region 146 separating the P-type doped region 142 from the N-type doped region 144, in accordance with some embodiments.

The P-type doped region 142 extends across the active region 112, in accordance with some embodiments. The P-type doped region 142 is partially over the isolation structure 120 adjacent to the active region 112, in accordance with some embodiments. The P-type doped region 142 is partially over the isolation structure 120 between the active regions 112 and 114, in accordance with some embodiments.

The N-type doped region 144 extends across the active region 114, in accordance with some embodiments. The N-type doped region 144 is partially over the isolation structure 120 adjacent to the active region 114, in accordance with some embodiments. The N-type doped region 144 is partially over the isolation structure 120 between the active regions 112 and 114, in accordance with some embodiments.

The spacing region 146 is over the isolation structure 120 between the active regions 112 and 114, in accordance with some embodiments. The entire spacing region 146 is directly over the isolation structure 120 between the active regions 112 and 114, in accordance with some embodiments. The spacing region 146 is narrower than the isolation structure 120 between the active regions 112 and 114, in accordance with some embodiments. That is, the width W1 of the spacing region 146 is less than the width W2 of the isolation structure 120 between the active regions 112 and 114, in accordance with some embodiments.

Figure 1G:
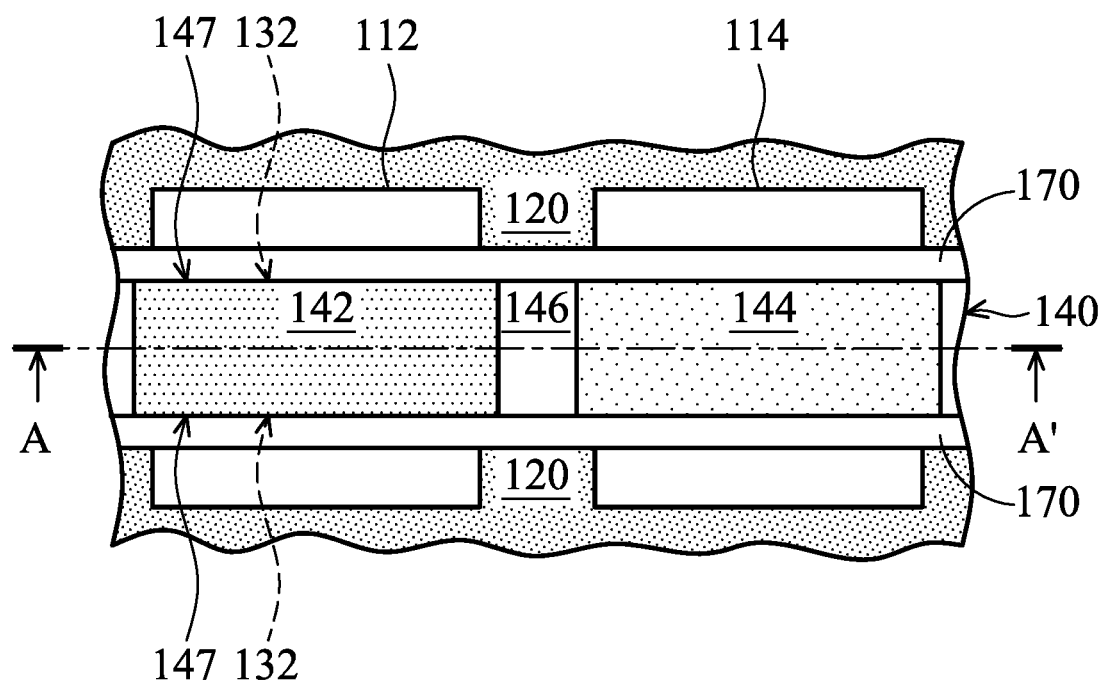
Figures 1, 1G:
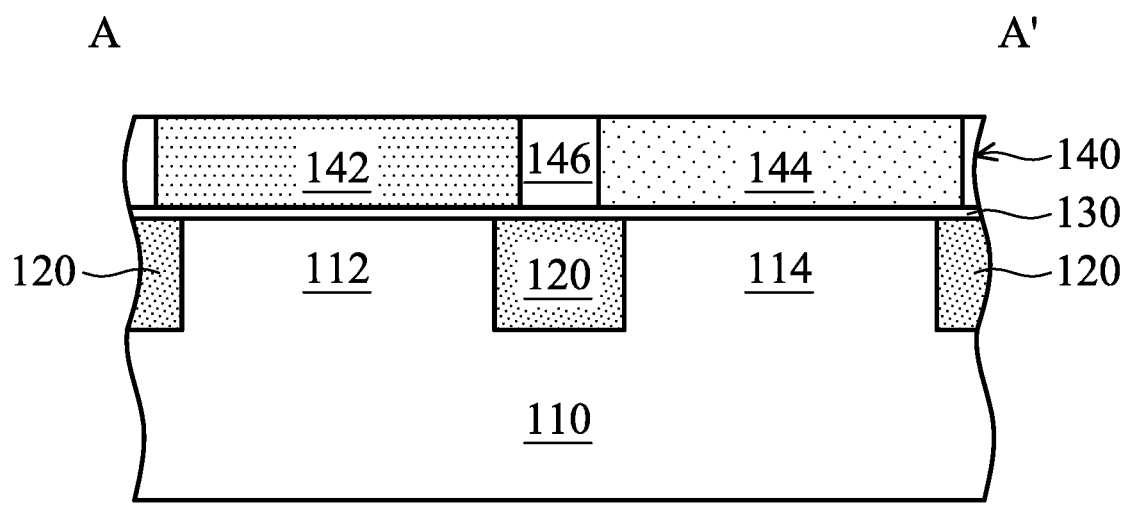
Figure 1H:
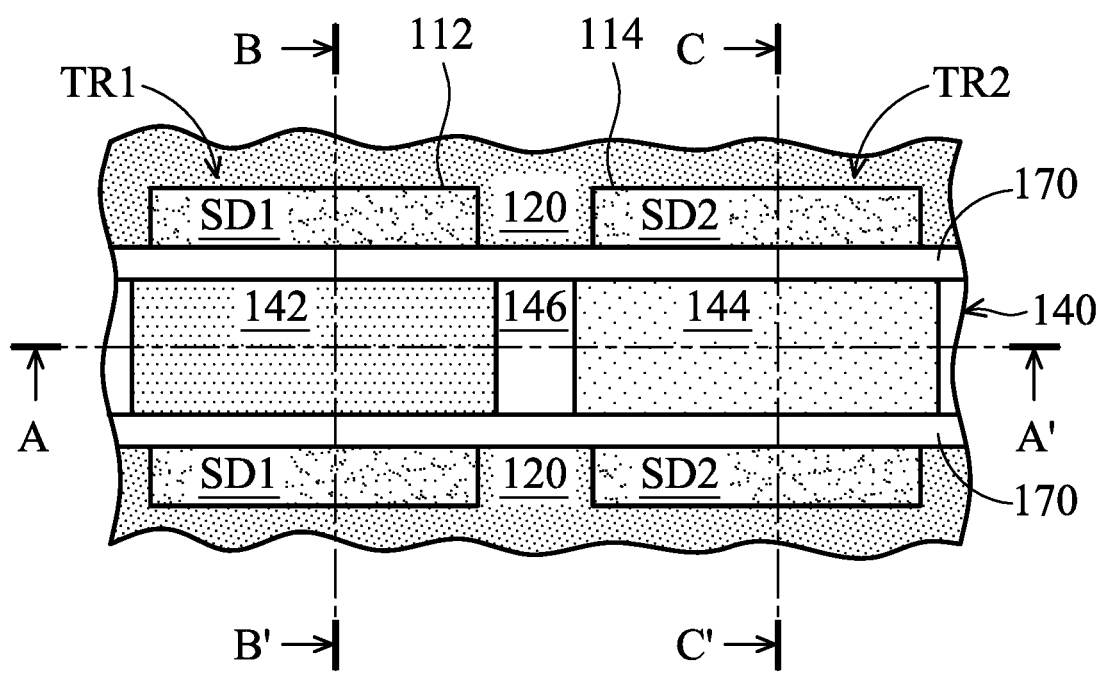
Figures 1, 1H:
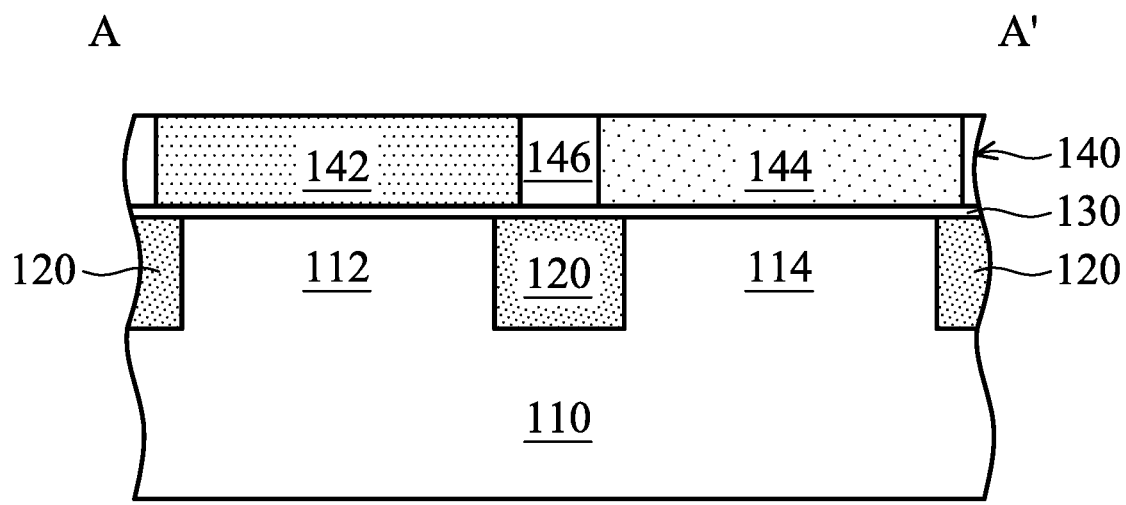

As shown in FIGS. 1G and 1G-1, a spacer layer 170 is formed over sidewalls 147 of the semiconductor strip structure 140 and sidewalls 132 of the gate dielectric layer 130, in accordance with some embodiments. The spacer layer 170 is made of insulating materials, such as silicon oxides or silicon nitrides, in accordance with some embodiments.

The formation of the spacer layer 170 includes: depositing a spacer material layer (not shown) over the semiconductor strip structure 140, the gate dielectric layer 130, the semiconductor substrate 110, and the isolation structure 120 by using, for example, a CVD process; and performing an anisotropic etching process (e.g. a dry etching process) to remove a portion of the spacer material layer so as to form the spacer layer 170. The spacer layer 170 is configured to electrically isolate the semiconductor strip structure 140 from other devices and to act as a mask layer in a subsequent ion implantation process.

As shown in FIGS. 1H, 1H-1, 1H-2, and 1H-3, doped regions SD1 are formed in the active region 112, in accordance with some embodiments. The doped regions SD1 are located at two opposite sides of the P-type doped region 142, in accordance with some embodiments. The P-type doped region 142 is configured as a gate electrode, in accordance with some embodiments. The doped regions SD1 are configured as a source region and a drain region, in accordance with some embodiments. The doped regions SD1 and the P-type doped region 142 together form a transistor TR1, in accordance with some embodiments.

The formation of the doped regions SD1 includes: forming a mask layer (not shown) over the semiconductor strip structure 140 and the active region 114; and performing an implantation process (e.g., an ion implantation process) over the active region 112 to implant dopants into the active region 112, in accordance with some embodiments.

The dopants include N-type dopants, such as nitrogen (N), phosphorous (P), arsenic (As), tellurium (Te), or bismuth (Bi), in accordance with some embodiments. In some other embodiments, the dopants include P-type dopants, such as boron (B), aluminum (Al), gallium (Ga), indium (In), or thallium (Tl), in accordance with some embodiments.

As shown in FIGS. 1H, 1H-1, 1H-2, and 1H-3, doped regions SD2 are formed in the active region 114, in accordance with some embodiments. The doped regions SD2 are located at two opposite sides of the N-type doped region 144, in accordance with some embodiments. The N-type doped region 144 is configured as a gate electrode, in accordance with some embodiments. The doped regions SD2 are configured as a source region and a drain region, in accordance with some embodiments. The doped regions SD2 and the N-type doped region 144 together form a transistor TR2, in accordance with some embodiments.

The formation of the doped regions SD2 includes: forming a mask layer (not shown) over the semiconductor strip structure 140 and the active region 112; and performing an implantation process (e.g., an ion implantation process) over the active region 114 to implant dopants into the active region 114, in accordance with some embodiments.

The dopants include P-type dopants, such as boron (B), aluminum (Al), gallium (Ga), indium (In), or thallium (Tl), in accordance with some embodiments. In some other embodiments, the dopants include N-type dopants, such as nitrogen (N), phosphorous (P), arsenic (As), tellurium (Te), or bismuth (Bi), in accordance with some embodiments.

As shown in FIGS. 1I, 1I-1, 1I-2, and 1I-3, an implantation process is performed over the spacing region 146 to form a disorder region 180 in a top portion of the spacing region 146, in accordance with some embodiments. Before the implantation process, the spacing region 146 is an undoped region, and therefore the lattice structure of the spacing region 146 is more ordered than that of the P-type doped region 142 and the N-type doped region 144, in accordance with some embodiments.

The implantation process converts the ordered top portion of the spacing region 146 into the disorder region 180, in accordance with some embodiments. The spacing region 146 has substantially no element of Group VA and Group IIIA, in accordance with some embodiments.

In some embodiments, the implantation process is further performed over the P-type doped region 142 and the N-type doped region 144 to form the disorder region 180 in top portions of the P-type doped region 142 and the N-type doped region 144, in accordance with some embodiments. In some embodiments, the implantation process is further performed over the doped regions SD1 and SD2 to form the disorder region 180 in top portions of the doped regions SD1 and SD2.

The implantation process implants dopants including elements of Group IVA or a noble gas element (i.e., an inert gas element) into the P-type doped region 142, the N-type doped region 144, the spacing region 146, and the doped regions SD1 and SD2, in accordance with some embodiments. The elements of Group IVA include Ge, Sn, or Pb, in accordance with some embodiments.

The noble gas element includes Ar, Kr, Xe, or Rn, in accordance with some embodiments. When the noble gas element includes Xe, the implantation energy ranges from about 2 KeV to about 30 KeV, and the implantation dosage ranges from about $1E14/cm^2$ to about $10E14/cm^2$, in accordance with some embodiments.

As shown in FIGS. 1J, 1J-1, 1J-2, and 1J-3, a metal layer 190 is formed over the disorder region 180, in accordance with some embodiments. The metal layer 190 is further formed over the spacer layer 170 and the isolation structure 120, in accordance with some embodiments. The metal layer 190 is made of nickel, cobalt, tantalum, titanium, platinum, erbium, palladium, tungsten, another suitable metal material, or a combination thereof, in accordance with some embodiments.

The metal layer 190 is formed using a deposition process, such as physical vapor deposition (PVD) (e.g., a sputtering process), a chemical vapor deposition (CVD) process, a plasma-enhanced chemical vapor deposition (PECVD) process, an atmospheric pressure chemical vapor deposition (APCVD) process, a low-pressure chemical vapor deposition (LPCVD) process, a high density plasma chemical vapor deposition (HDPCVD) process, or an atomic layer chemical vapor deposition (ALCVD) process, in accordance with some embodiments.

As shown in FIGS. 1K, 1K-1, 1K-2, and 1K-3, the metal layer 190 and the disorder region 180 are annealed to form a metal silicide layer 210, in accordance with some embodiments. The metal silicide layer 210 is formed over the semiconductor strip structure 140 to cover the P-type doped region 142, the N-type doped region 144, and the spacing region 146, in accordance with some embodiments.

The metal silicide layer 210 covers an entire top surface 141 of the semiconductor strip structure 140, in accordance with some embodiments. The metal silicide layer 210 conformally covers the entire top surface 141, in accordance with some embodiments. The metal silicide layer 210 continuously covers the P-type doped region 142, the N-type doped region 144, and the spacing region 146, in accordance with some embodiments.

The metal silicide layer 210 is further formed over the doped regions SD1 and SD2, in accordance with some embodiments. The metal silicide layer 210 covers entire top surfaces S1 of the doped regions SD1, in accordance with some embodiments. The metal silicide layer 210 conformally covers the entire top surfaces S1, in accordance with some embodiments. The metal silicide layer 210 covers entire top surfaces S2 of the doped regions SD2, in accordance with some embodiments. The metal silicide layer 210 conformally covers the entire top surfaces S2, in accordance with some embodiments.

The metal silicide layer 210 over the spacing region 146 has a thickness T1, in accordance with some embodiments. The metal silicide layer 210 over the P-type doped region 142 has a thickness T2, in accordance with some embodiments. The metal silicide layer 210 over the N-type doped region 144 has a thickness T3, in accordance with some embodiments. The thicknesses T1, T2, and T3 are substantially equal to each other, in accordance with some embodiments.

The term "substantially equal to" means "within 20%", in accordance with some embodiments. For example, the term "substantially equal to" means the difference between the thicknesses T1, T2, and T3 is within 20% of the average thickness between the metal silicide layer 210 over the spacing region 146, the metal silicide layer 210 over the P-type doped region 142, and the metal silicide layer 210 over the N-type doped region 144, in accordance with some embodiments. The difference may be due to manufacturing processes.

In some embodiments, the term "substantially equal to" means "within 10%", in accordance with some embodiments. For example, the term "substantially equal to" means the difference between the thicknesses T1, T2, and T3 is within 10% of the average thickness between the metal silicide layer 210 over the spacing region 146, the metal silicide layer 210 over the P-type doped region 142, and the metal silicide layer 210 over the N-type doped region 144, in accordance with some embodiments.

The metal silicide layer 210 is configured to reduce resistance between conductive elements (e.g., a conductive plug, a via, and/or a conductive layer) and the semiconductor strip structure 140, in accordance with some embodiments. The metal silicide layer 210 is further configured to reduce resistance between conductive elements (e.g., a conductive plug, a via, and/or a conductive layer) and the doped regions SD1 and SD2, in accordance with some embodiments. The resistance includes contact resistance (Rc) and sheet resistance (Rs), in accordance with some embodiments.

Before performing the implantation process over the spacing region 146, the spacing region 146 is an undoped region, and therefore the lattice structure of the spacing region 146 is more ordered than that of the P-type doped region 142 and the N-type doped region 144, in accordance with some embodiments.

Since the metal silicide layer 210 tends to form in disorder lattice structures, the implantation process performed over the spacing region 146 forms the disorder region 180 in the top portion of the spacing region 146 and increases the thickness T1 of the metal silicide layer 210 over the spacing region 146, in accordance with some embodiments. Therefore, the implantation process performed over the spacing region 146 improves the uniformity of the thicknesses T1, T2, and T3 of the metal silicide layer 210 over the spacing region 146, the metal silicide layer 210 over the P-type doped region 142, and the metal silicide layer 210 over the N-type doped region 144, in accordance with some embodiments. As a result, the implantation process performed over the spacing region 146 reduces the resistance between conductive elements and the semiconductor strip structure 140, in accordance with some embodiments.

The metal silicide layer 210 is made of a silicide such as nickel silicide, cobalt silicide, tungsten silicide, tantalum silicide, titanium silicide, platinum silicide, erbium silicide, palladium silicide, another suitable material, or a combination thereof, in accordance with some embodiments.

The annealing process includes a rapid thermal anneal (RTA) process performed in a gas atmosphere such as Ar, He, N2, or other inert gas, in accordance with some embodiments. The annealing process is also referred to as a salicide process or a silicide process, in accordance with some embodiments.

As shown in FIGS. 1K, 1K-1, 1K-2, and 1K-3, after the annealing process is performed, a portion of the metal layer 190 is un-reacted and remains over the metal silicide layer 210, in accordance with some embodiments. As shown in FIGS. 1L, 1L-1, 1L-2, and 1L-3, the un-reacted portion of the metal layer 190 is removed, in accordance with some embodiments.

As shown in FIGS. 1M, 1M-1, 1M-2, and 1M-3, a dielectric layer 230 is formed over the semiconductor substrate 110 to cover the metal silicide layer 210 and the transistors TR1 and TR2, in accordance with some embodiments. The dielectric layer 230 is made of oxide (such as silicon oxide), in accordance with some embodiments.

The dielectric layer 230 has through holes 232, 234, and 236 passing through the dielectric layer 230, in accordance with some embodiments. The through hole 232 exposes a portion of the metal silicide layer 210, in accordance with some embodiments. The through hole 232 is over the P-type doped region 142, in accordance with some embodiments. In some other embodiments (not shown), the through hole 232 is over the N-type doped region 144 or the spacing region 146.

The through holes 234 and 236 expose portions of the metal silicide layer 210, in accordance with some embodiments. The through holes 234 are over the doped regions SD1, in accordance with some embodiments. The through holes 236 are over the doped regions SD2, in accordance with some embodiments.

As shown in FIGS. 1M, 1M-1, 1M-2, and 1M-3, contact plugs 242, 244, and 246 are respectively formed in the through holes 232, 234, and 236, in accordance with some embodiments. The contact plugs 242, 244, and 246 are also referred to as contact structures, in accordance with some embodiments. The contact plugs 242, 244, and 246 are made of tungsten (W), aluminum (Al), copper (Cu), or another suitable conductive material. The contact plug 242 is electrically connected to the metal silicide layer 210 thereunder, the P-type doped region 142, and the N-type doped region 144, in accordance with some embodiments.

The contact plugs 244 are electrically connected to the doped regions SD1 through the metal silicide layer 210 therebetween, in accordance with some embodiments. The contact plugs 246 are electrically connected to the doped regions SD2 through the metal silicide layer 210 therebetween, in accordance with some embodiments.

Figures 1, 1H, 2:
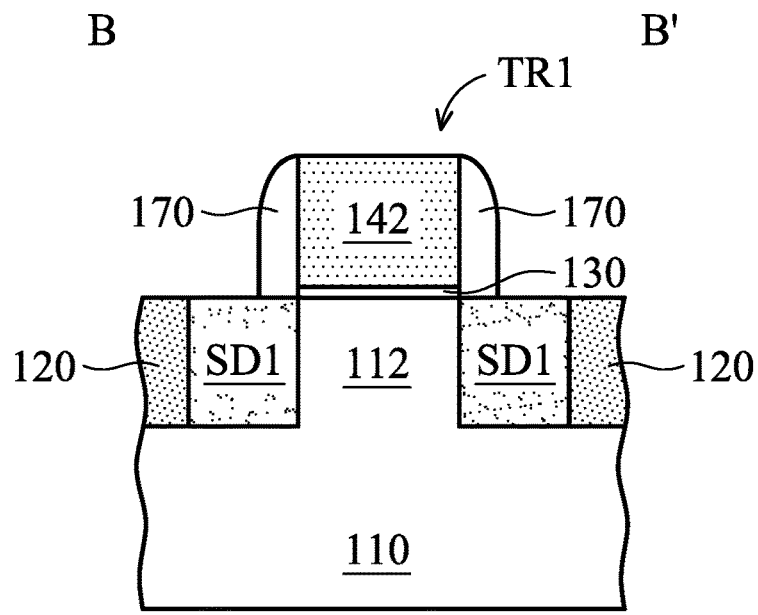
Figures 1, 1H, 2, 3:
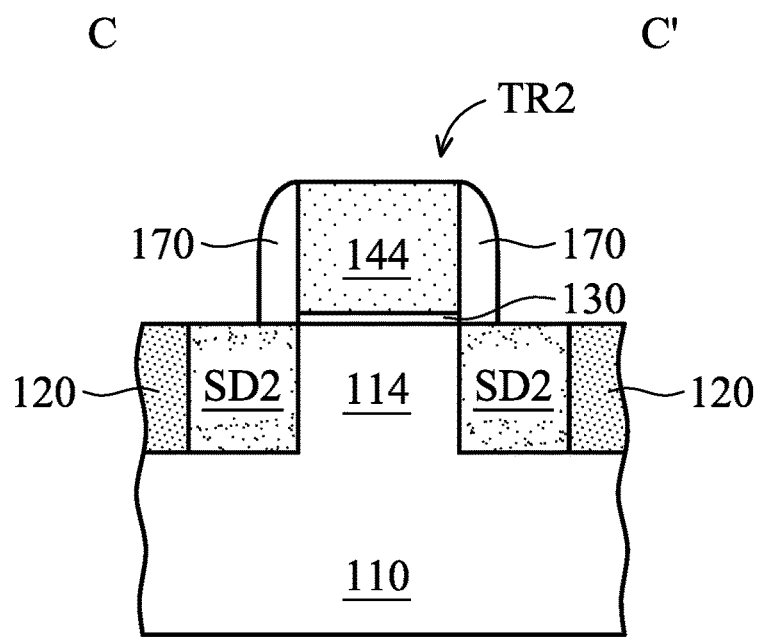
Figure 1I:
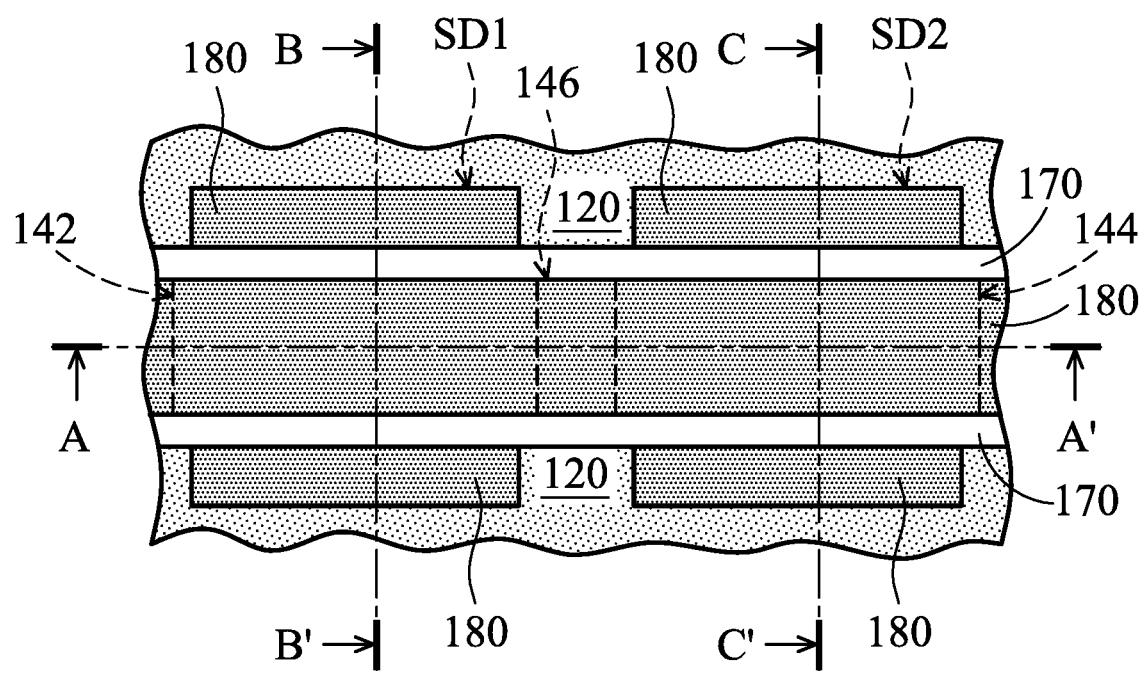
Figures 1, 1I:
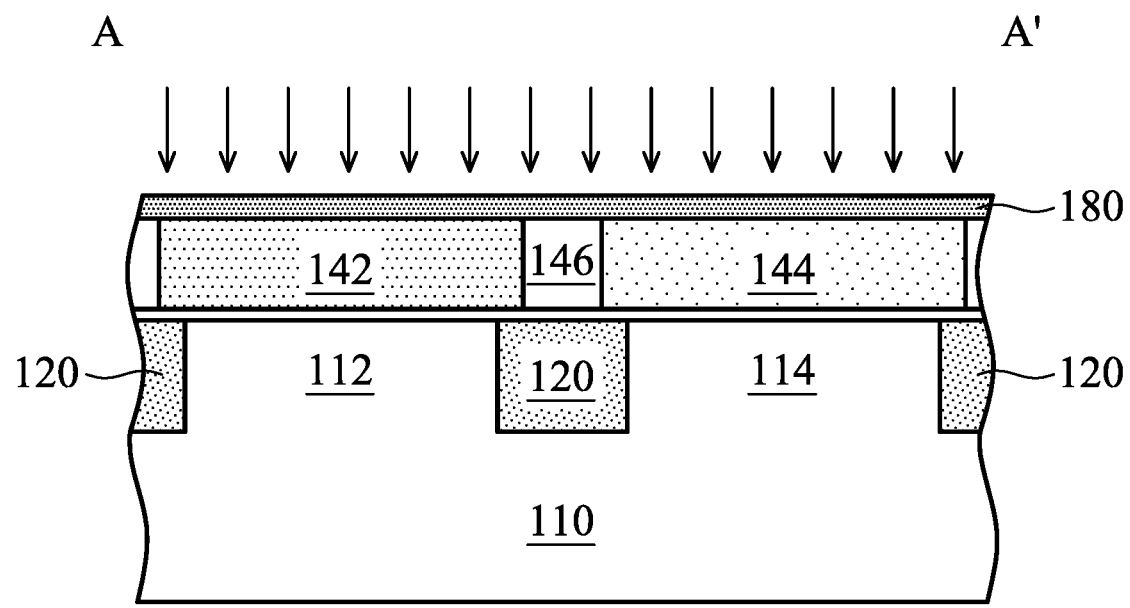
Figures 1, 1I, 2:
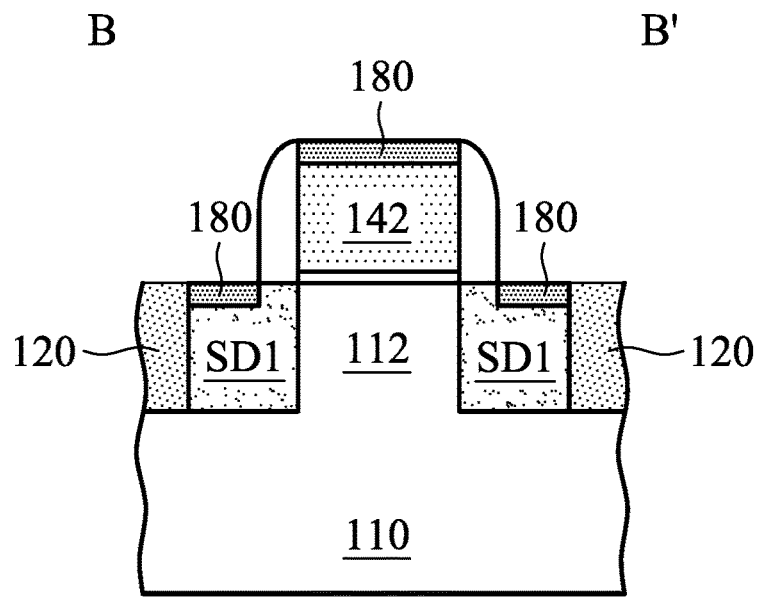
Figures 1, 1I, 2, 3:
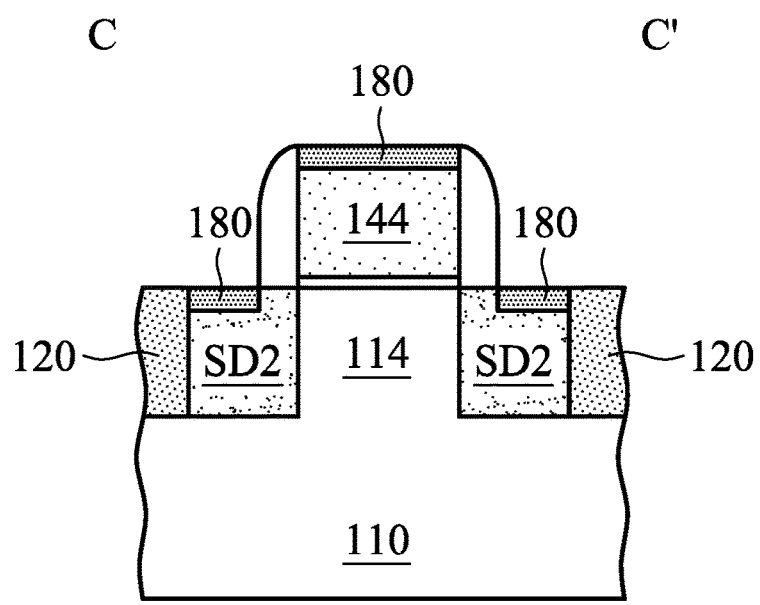
Figure 1J:
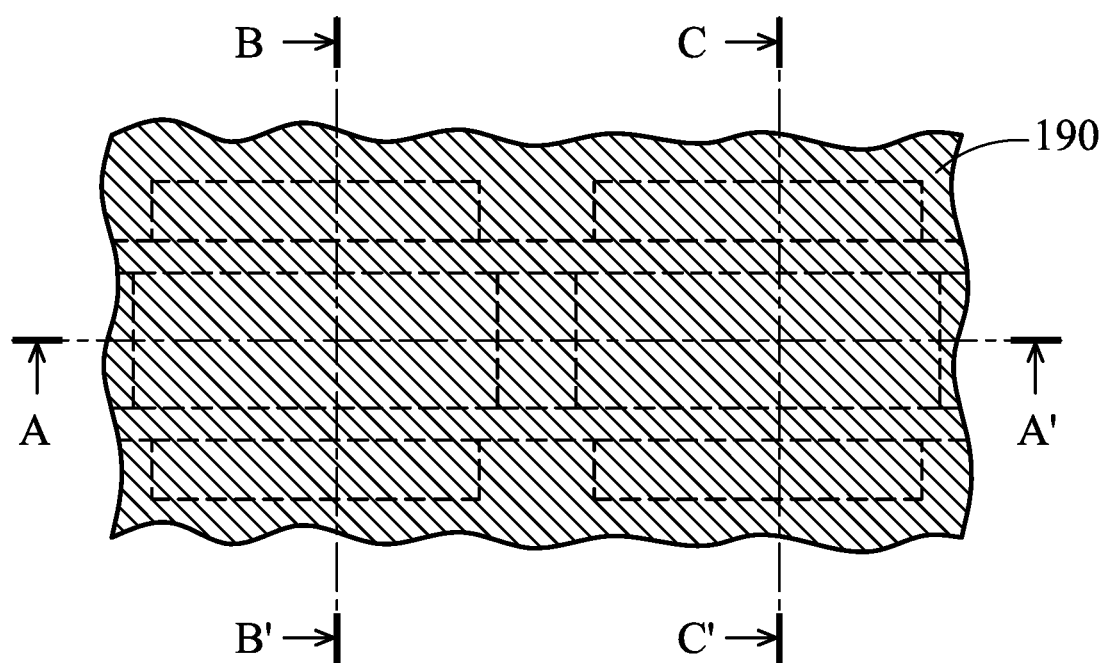
Figures 1, 1J:
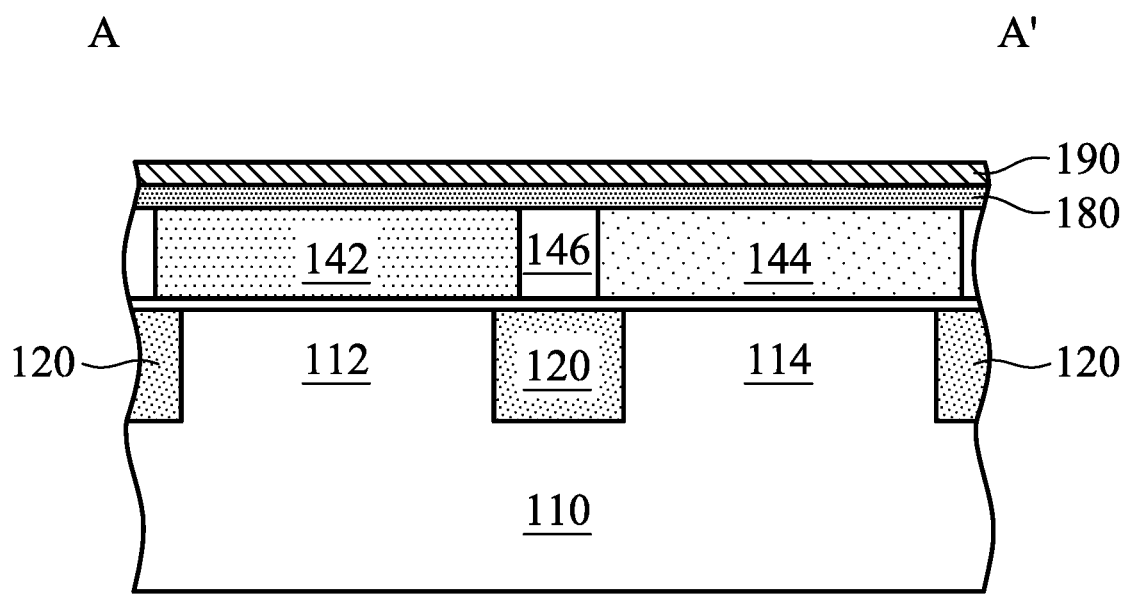
Figures 1, 1J, 2:
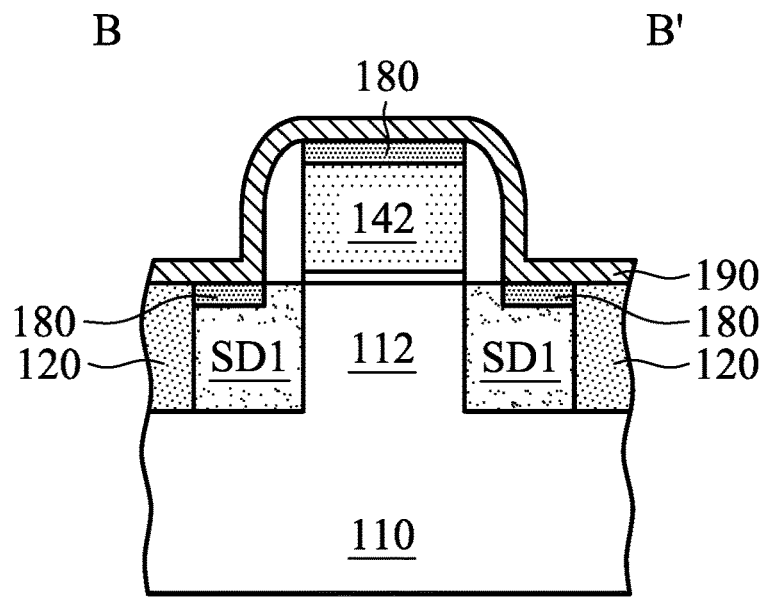
Figures 1, 1J, 2, 3:
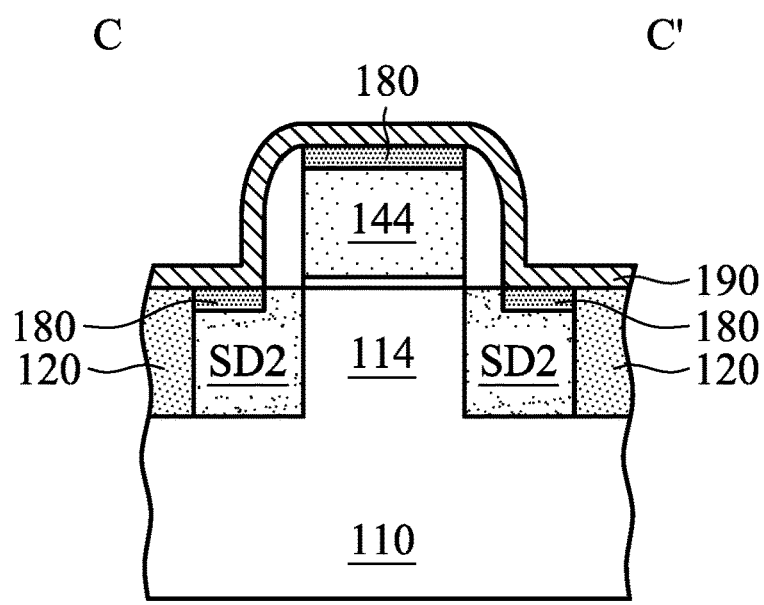
Figure 1K:
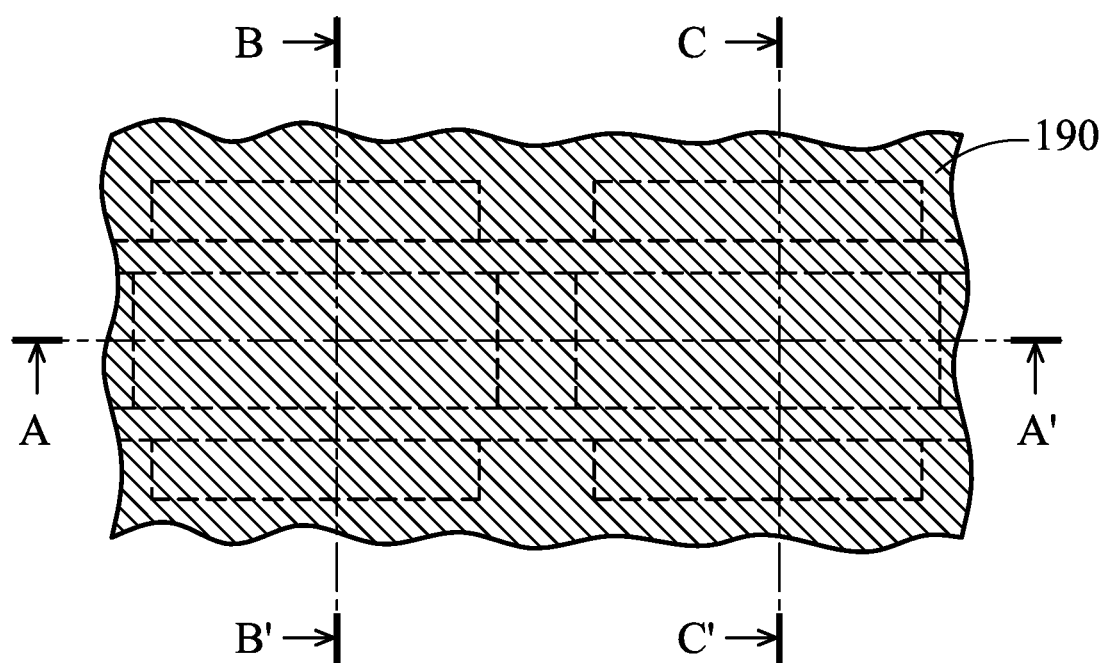
Figures 1, 1K:
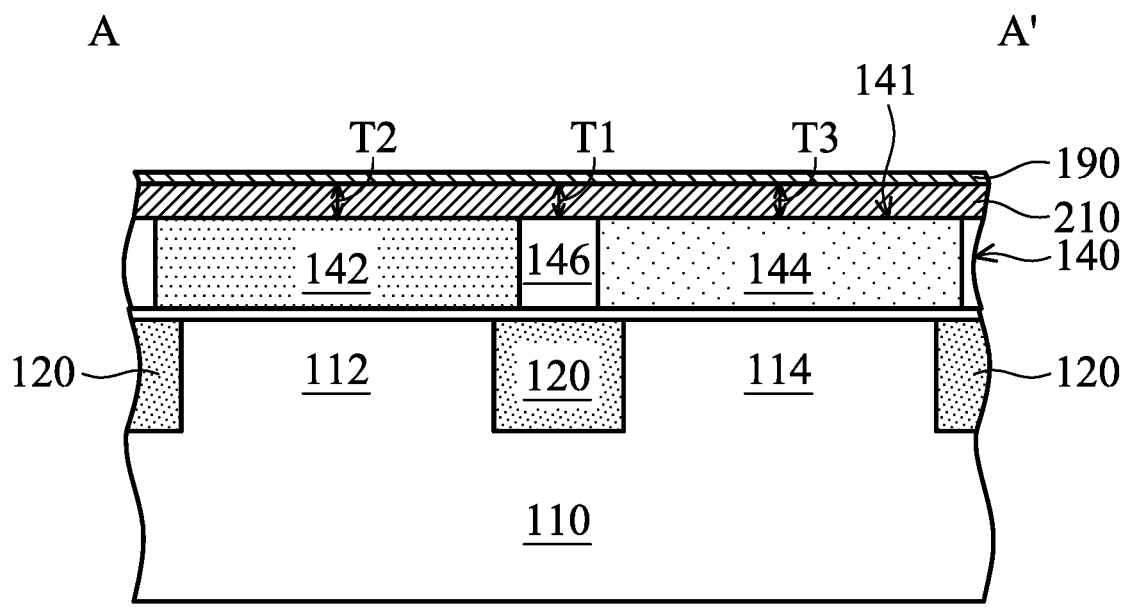
Figures 1, 1K, 2:
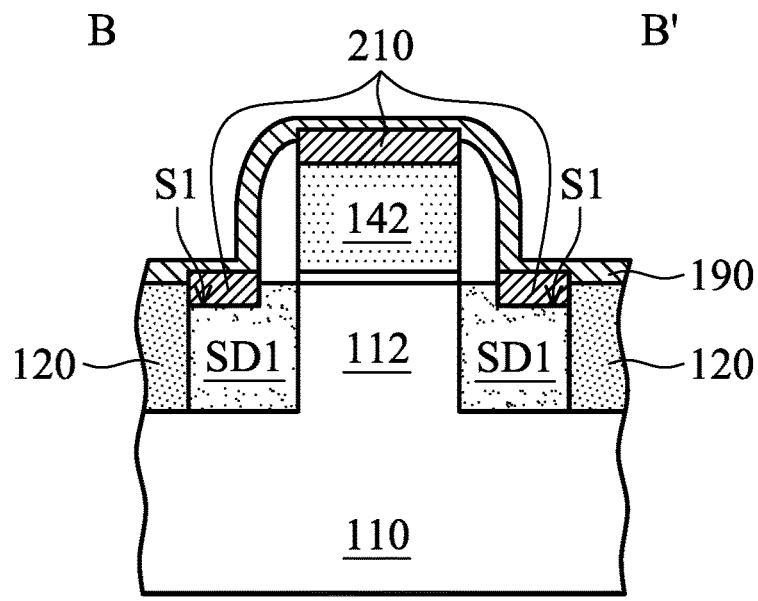
Figures 1, 1K, 2, 3:
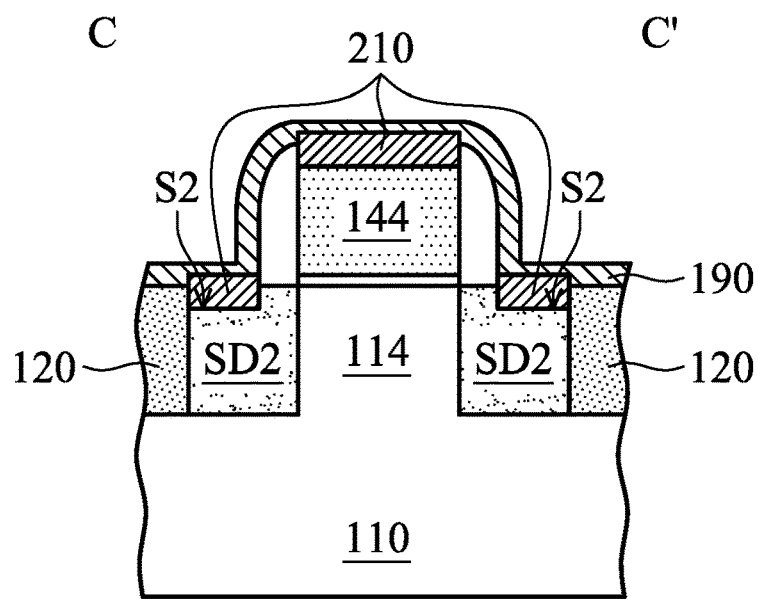
Figure 2A:
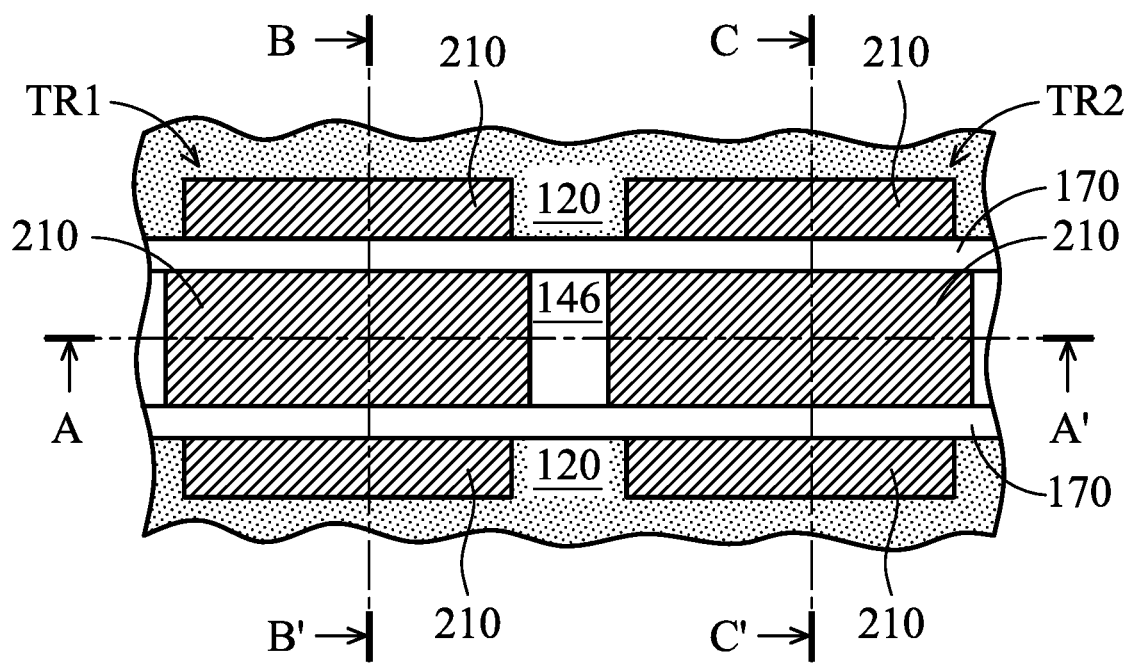
FIGS. 2A-2B are top views of various stages of a process for forming a semiconductor device structure, in accordance with some embodiments.
Figures 1, 2A:
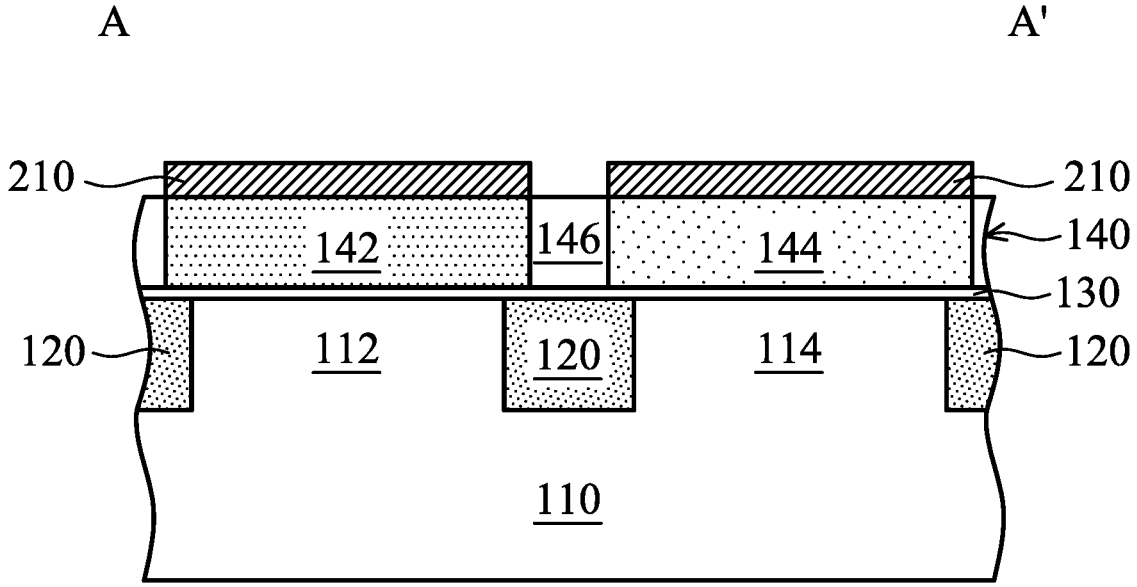
Figures 2, 2A:
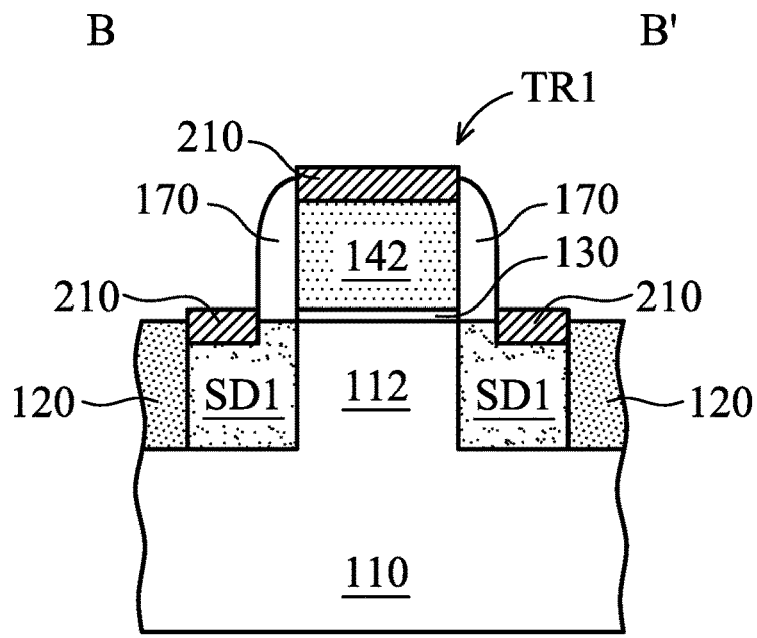
Figures 2, 2A, 3:
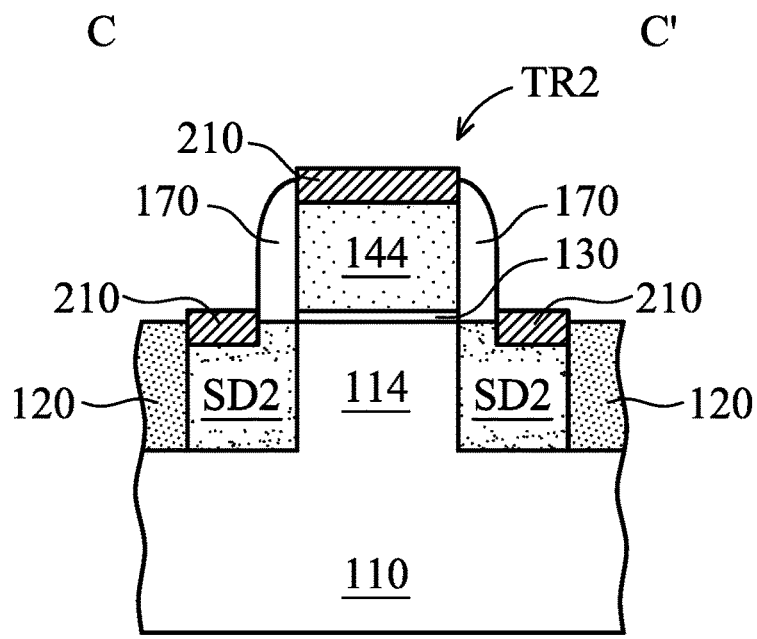
Figure 2B:
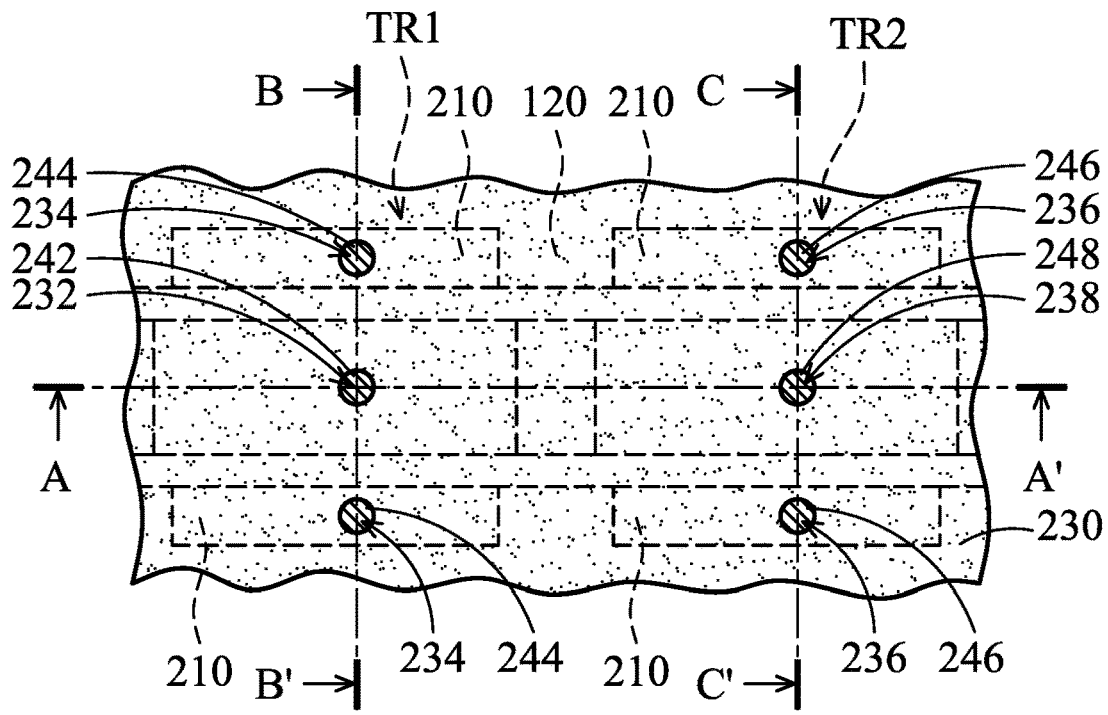
Figures 1, 2B:
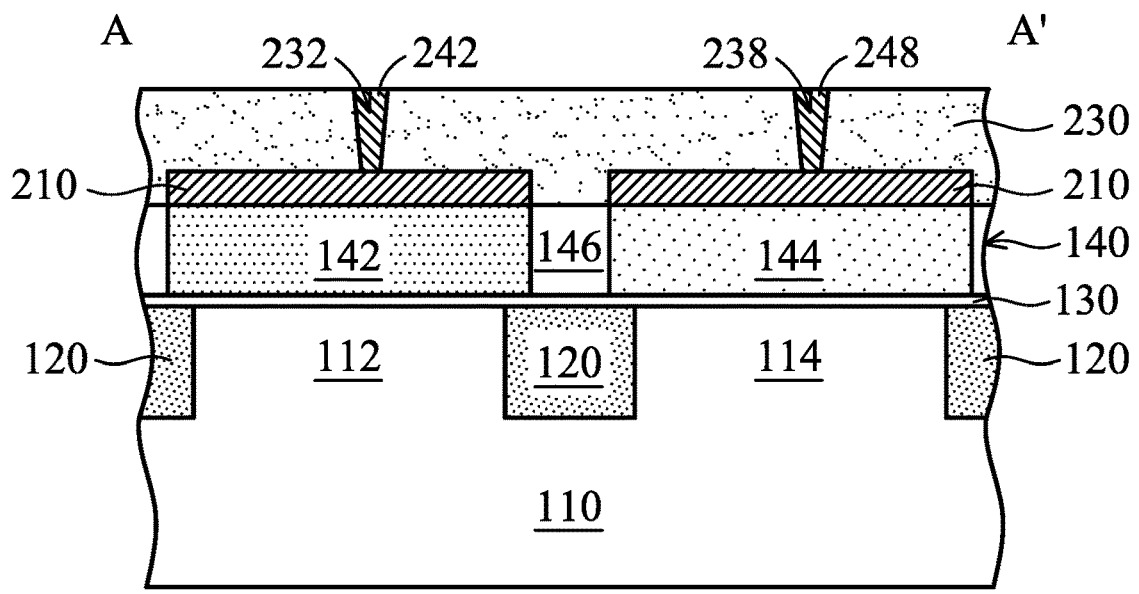
Figures 2, 2B:
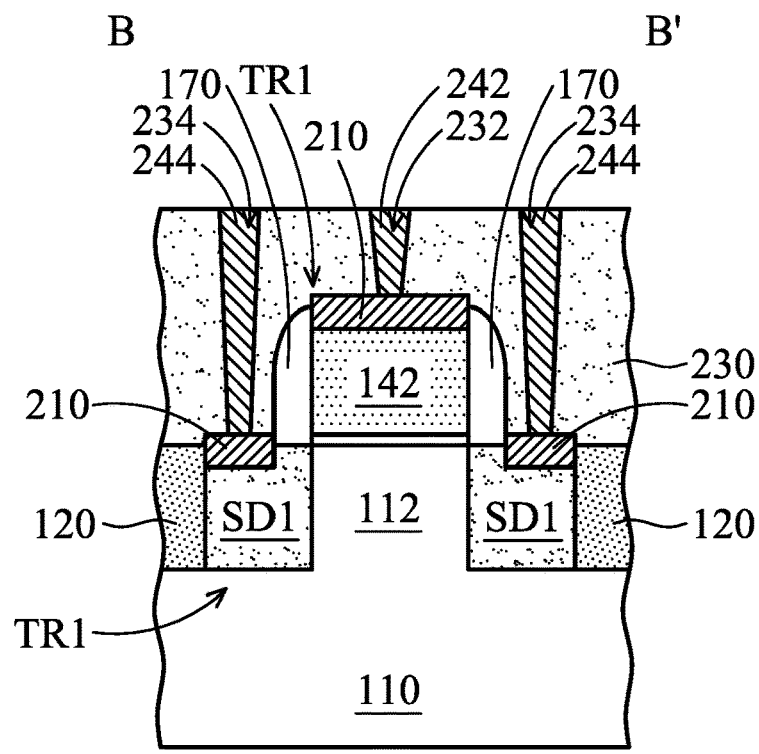
Figures 2, 2B, 3:
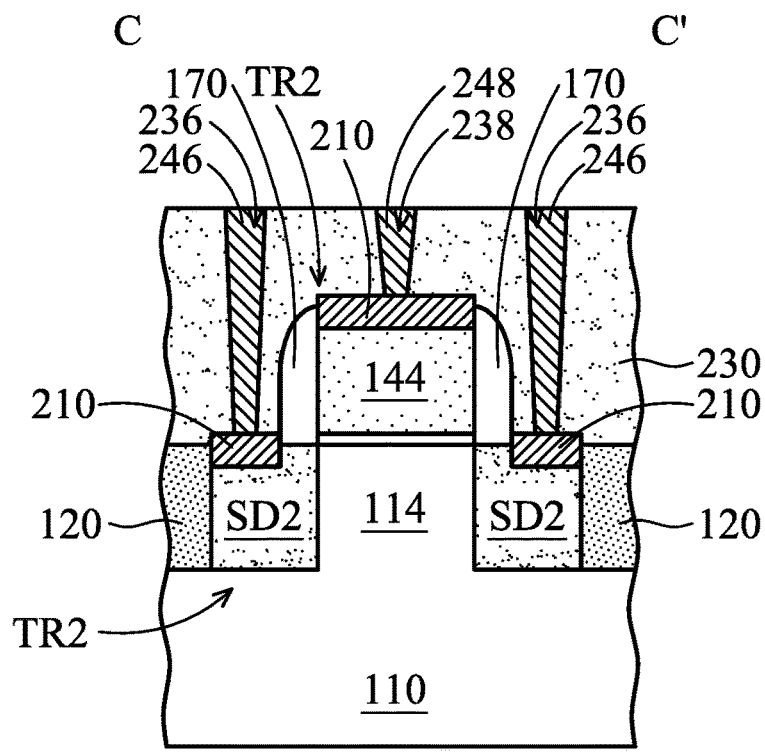

FIGS. 2A-2B are top views of various stages of a process for forming a semiconductor device structure, in accordance with some embodiments. FIGS. 2A-1 to 2B-1 are cross-sectional views illustrating the semiconductor device structure along a sectional line A-A' in FIGS. 2A-2B, in accordance with some embodiments. FIGS. 2A-2 to 2B-2 are cross-sectional views illustrating the semiconductor device structure along a sectional line B-B' in FIGS. 2A-2B, in accordance with some embodiments. FIGS. 2A-3 to 2B-3 are cross-sectional views illustrating the semiconductor device structure along a sectional line C-C' in FIGS. 2A-2B, in accordance with some embodiments.

Figure 1L:
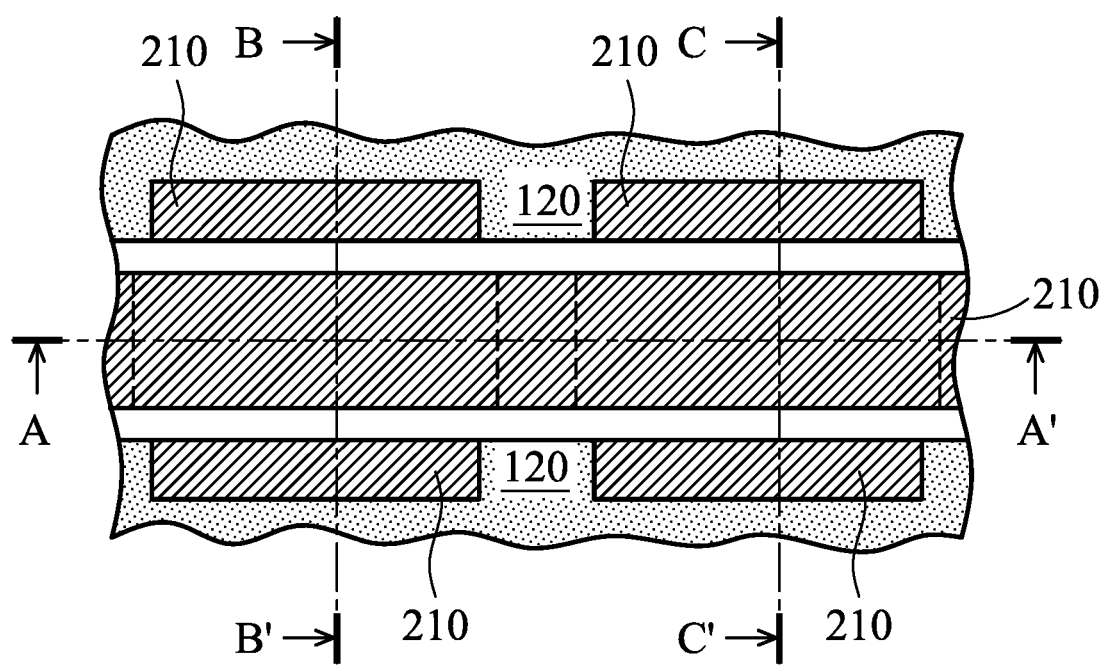
Figures 1, 1L:
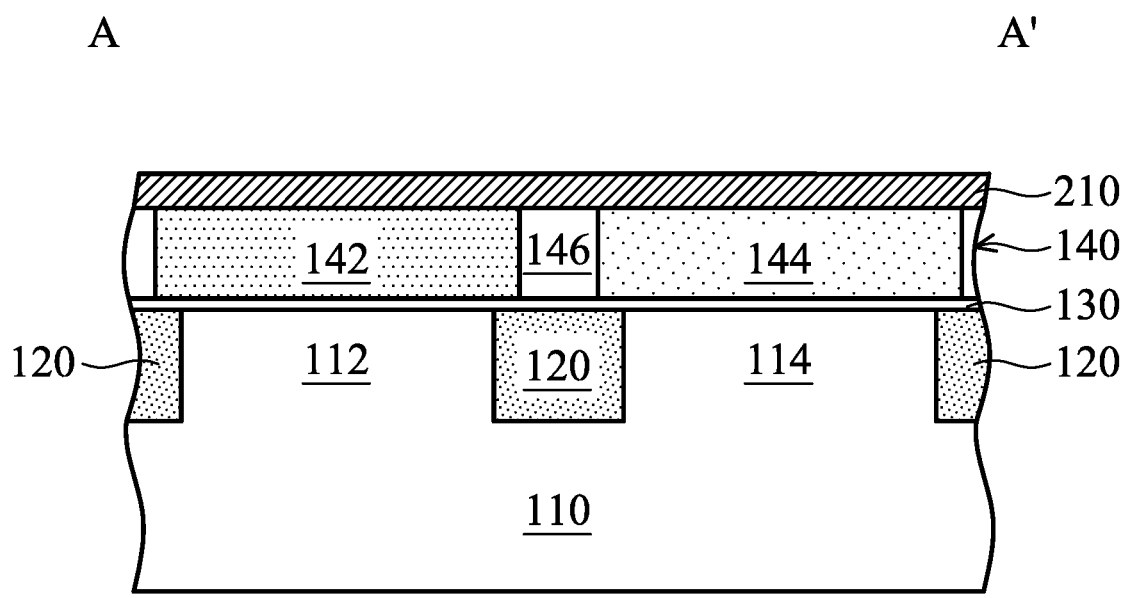
Figures 1, 1L, 2:
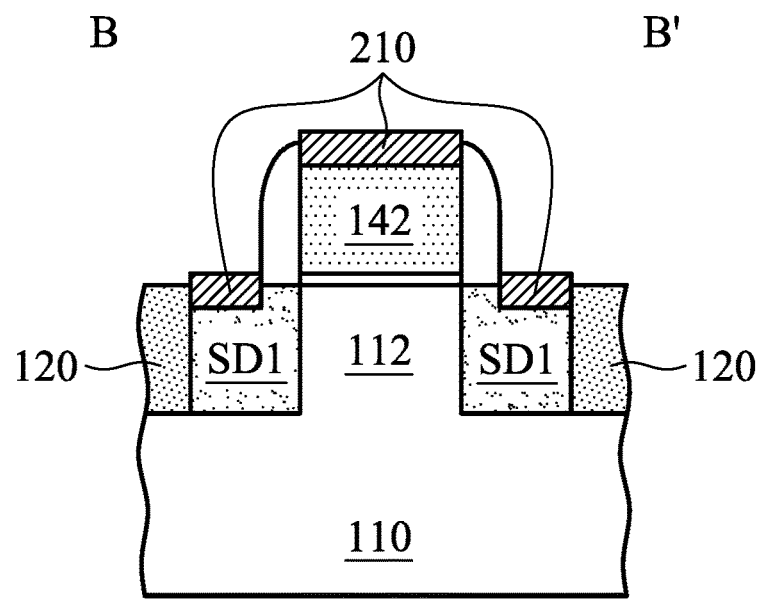
Figures 1, 1L, 2, 3:
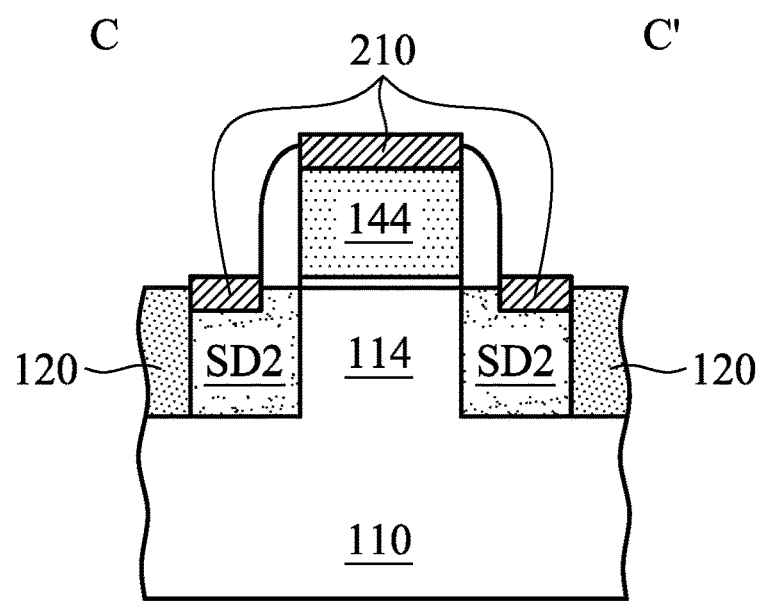
Figure 1M:
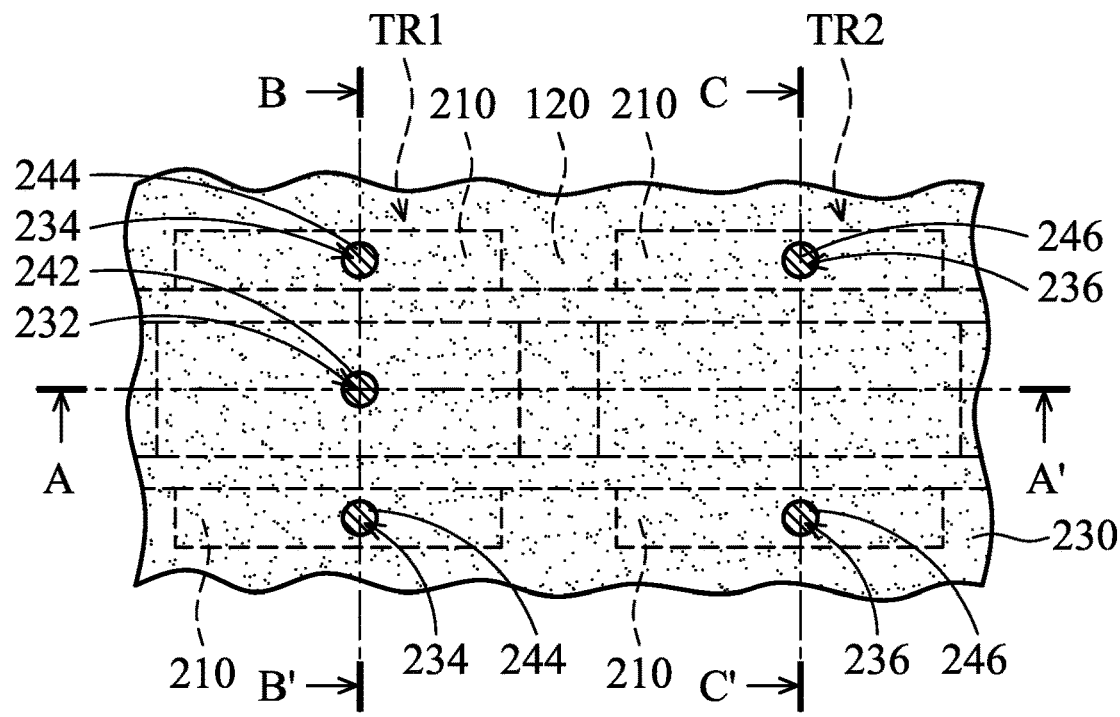
Figures 1, 1M:
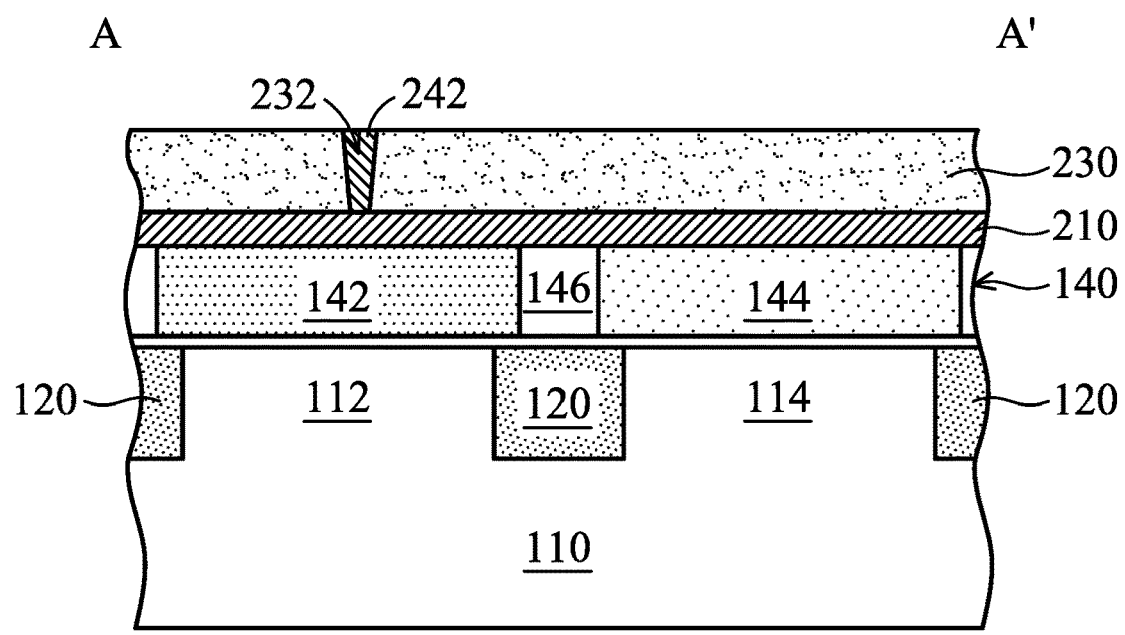
Figures 1, 1M, 2:
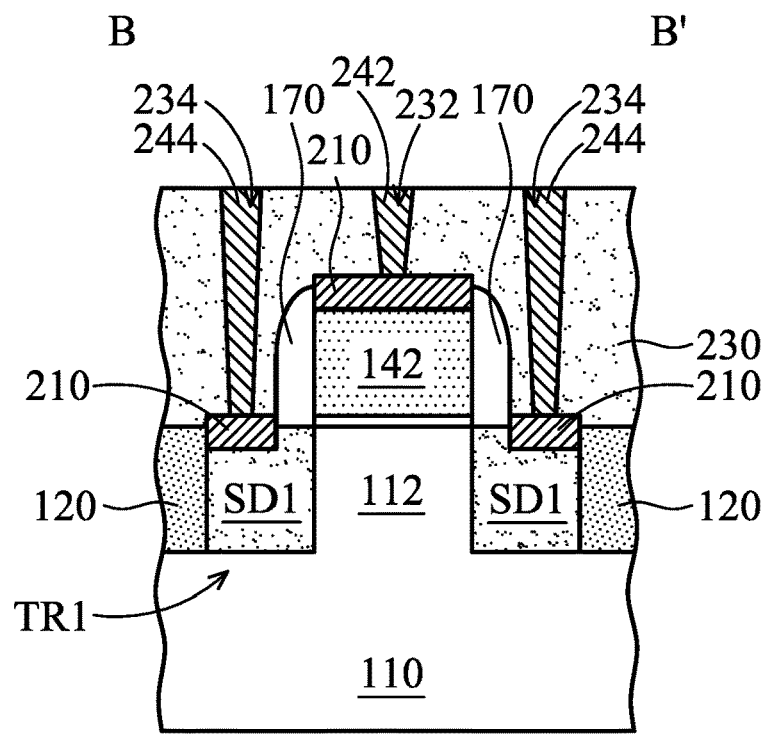
Figures 1, 1M, 2, 3:
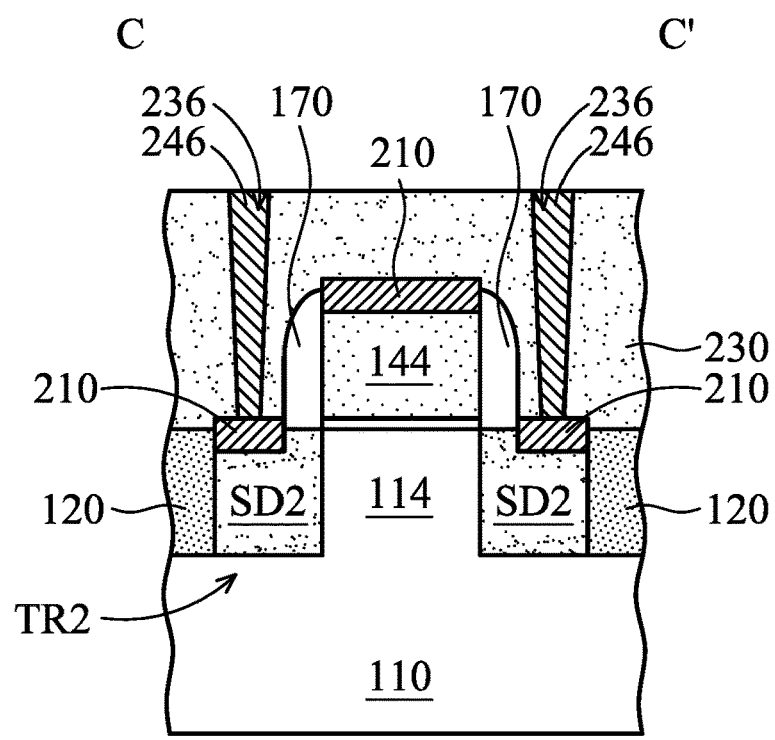

As shown in FIGS. 2A, 2A-1, 2A-2, and 2A-3, after the step of FIG. 1L, the metal silicide layer 210 over the spacing region 146 is removed, in accordance with some embodiments. As shown in FIGS. 2B, 2B-1, 2B-2, and 2B-3, a dielectric layer 230 is formed over the semiconductor substrate 110 to cover the metal silicide layer 210, and the transistors TR1 and TR2, in accordance with some embodiments. The dielectric layer 230 is made of oxide (such as silicon oxide), in accordance with some embodiments.

The dielectric layer 230 has through holes 232, 234, 236, and 238 passing through the dielectric layer 230, in accordance with some embodiments. The through hole 232 exposes a portion of the metal silicide layer 210, in accordance with some embodiments. The through hole 232 is over the P-type doped region 142, in accordance with some embodiments.

The through holes 234 and 236 expose portions of the metal silicide layer 210, in accordance with some embodiments. The through holes 234 are over the doped regions SD1, in accordance with some embodiments. The through holes 236 are over the doped regions SD2, in accordance with some embodiments. The through hole 238 exposes a portion of the metal silicide layer 210, in accordance with some embodiments. The through hole 238 is over the N-type doped region 144, in accordance with some embodiments.

As shown in FIGS. 2B, 2B-1, 2B-2, and 2B-3, contact plugs 242, 244, 246, and 248 are respectively formed in the through holes 232, 234, 236, and 238, in accordance with some embodiments. The contact plugs 242, 244, 246, and 248 are made of tungsten (W), aluminum (Al), copper (Cu), or another suitable conductive material.

The contact plug 242 is electrically connected to the metal silicide layer 210 thereunder and the P-type doped region 142, in accordance with some embodiments. The contact plug 248 is electrically connected to the metal silicide layer 210 thereunder and the N-type doped region 144, in accordance with some embodiments.

The contact plugs 244 are electrically connected to the doped regions SD1 through the metal silicide layer 210 therebetween, in accordance with some embodiments. The contact plugs 246 are electrically connected to the doped regions SD2 through the metal silicide layer 210 therebetween, in accordance with some embodiments.

In accordance with some embodiments, semiconductor device structures and methods for forming the same are provided. The methods (for forming the semiconductor device structure) perform an implantation process over a spacing region between a P-type doped region and an N-type doped region before forming a metal silicide layer over a semiconductor strip structure, which includes the spacing region, the P-type doped region, and the N-type doped region. The implantation process forms a disorder region in a top portion of the spacing region and therefore increases the thickness of the metal silicide layer formed over the spacing region. As a result, the implantation process performed over the spacing region improves the uniformity of thicknesses of the metal silicide layer over the spacing region, the P-type doped region, and the N-type doped region. Therefore, the implantation process performed over the spacing region reduces the resistance between conductive elements and the semiconductor strip structure.

In accordance with some embodiments, a method for forming a semiconductor device structure is provided. The method includes providing a semiconductor substrate. The method includes forming an isolation structure in the semiconductor substrate. The isolation structure surrounds a first active region and a second active region of the semiconductor substrate. The method includes forming a semiconductor strip structure over the semiconductor substrate. The semiconductor strip structure extends across the first active region, the second active region, and the isolation structure between the first active region and the second active region, the semiconductor strip structure has a P-type doped region, an N-type doped region, and a spacing region separating the P-type doped region from the N-type doped region, the P-type doped region extends across the first active region, the N-type doped region extends across the second active region, and the spacing region is over the isolation structure. The method includes performing an implantation process over the spacing region. The method includes forming a metal silicide layer over the semiconductor strip structure to cover the P-type doped region, the N-type doped region, and the spacing region.

In accordance with some embodiments, a method for forming a semiconductor device structure is provided. The method includes providing a semiconductor substrate. The method includes forming an isolation structure in the semiconductor substrate. The isolation structure surrounds a first active region and a second active region of the semiconductor substrate. The method includes forming a semiconductor strip structure over the semiconductor substrate. The semiconductor strip structure extends across the first active region, the second active region, and the isolation structure between the first active region and the second active region, the semiconductor strip structure has a P-type doped region, an N-type doped region, and a spacing region between the P-type doped region and the N-type doped region, the P-type doped region extends across the first active region, the N-type doped region extends across the second active region, and the spacing region is over the isolation structure. The method includes performing an implantation process over the P-type doped region, the N-type doped region, and the spacing region. The method includes forming a metal silicide layer over the P-type doped region, the N-type doped region, and the spacing region.

In accordance with some embodiments, a method for forming a semiconductor device structure is provided. The method includes providing a semiconductor substrate. The method includes forming an isolation structure in the semiconductor substrate. The isolation structure surrounds a first active region and a second active region of the semiconductor substrate. The method includes forming a semiconductor strip structure over the semiconductor substrate. The semiconductor strip structure extends across the first active region, the second active region, and the isolation structure between the first active region and the second active region, the semiconductor strip structure has a first doped region, a second doped region, and a spacing region between the first doped region and the second doped region, the first doped region extends across the first active region, the second doped region extends across the second active region, and the spacing region is over the isolation structure. The method includes performing an implantation process over the first doped region, the second doped region, and the spacing region. The method includes forming a metal silicide layer over the first doped region, the second doped region, and the spacing region. The metal silicide layer continuously covers the first doped region, the second doped region, and the spacing region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   providing a semiconductor substrate;
   forming an isolation structure in the semiconductor substrate, wherein the isolation structure surrounds a first active region and a second active region of the semiconductor substrate;
   forming a semiconductor strip structure over the semiconductor substrate, wherein the semiconductor strip structure extends across the first active region, the second active region, and the isolation structure between the first active region and the second active region, the semiconductor strip structure has a P-type doped region, an N-type doped region, and a spacing region separating the P-type doped region from the N-type doped region, the P-type doped region extends across the first active region, the N-type doped region extends across the second active region, and the spacing region is over the isolation structure;
   performing an implantation process over the spacing region; and
   forming a metal silicide layer over the semiconductor strip structure to cover the P-type doped region, the N-type doped region, and the spacing region.

2. The method for forming the semiconductor device structure as claimed in claim 1, further comprising:
   forming a contact structure over the metal silicide layer.

3. The method for forming the semiconductor device structure as claimed in claim 2, wherein the contact structure is electrically connected to the P-type doped region and the N-type doped region.

4. The method for forming the semiconductor device structure as claimed in claim 1, wherein the metal silicide layer is in direct contact with the semiconductor strip structure.

5. The method for forming the semiconductor device structure as claimed in claim 1, further comprising:
   after forming the metal silicide layer, removing the metal silicide layer over the spacing region.

6. The method for forming the semiconductor device structure as claimed in claim 1, wherein the spacing region electrically insulates the P-type doped region from the N-type doped region.

7. The method for forming the semiconductor device structure as claimed in claim 6, wherein before the implantation process, the spacing region is an undoped region.

8. The method for forming the semiconductor device structure as claimed in claim 7, wherein the spacing region has substantially no element of Group VA and Group IIIA.

9. A method for forming a semiconductor device structure, comprising:
   providing a semiconductor substrate;
   forming an isolation structure in the semiconductor substrate, wherein the isolation structure surrounds a first active region and a second active region of the semiconductor substrate;
   forming a semiconductor strip structure over the semiconductor substrate, wherein the semiconductor strip structure extends across the first active region, the second active region, and the isolation structure between the first active region and the second active region, the semiconductor strip structure has a P-type doped region, an N-type doped region, and a spacing region between the P-type doped region and the N-type doped region, the P-type doped region extends across the first active region, the N-type doped region extends across the second active region, and the spacing region is over the isolation structure;
   performing an implantation process over the P-type doped region, the N-type doped region, and the spacing region; and
   forming a metal silicide layer over the P-type doped region, the N-type doped region, and the spacing region.

10. The method for forming the semiconductor device structure as claimed in claim 9, wherein the implantation process implants elements of Group IVA or a noble gas element into the P-type doped region, the N-type doped region, and the spacing region.

11. The method for forming the semiconductor device structure as claimed in claim 10, wherein the elements of Group IVA comprises Ge, Sn, or Pb, and the noble gas element comprises Ar, Kr, Xe, or Rn.

12. The method for forming the semiconductor device structure as claimed in claim 9, wherein the spacing region electrically insulates the P-type doped region from the N-type doped region.

13. The method for forming the semiconductor device structure as claimed in claim 9, wherein the metal silicide layer covers an entire top surface of the semiconductor strip structure.

14. The method for forming the semiconductor device structure as claimed in claim 9, wherein the metal silicide layer over the spacing region has a first thickness, the metal silicide layer over the P-type doped region has a second thickness, the metal silicide layer over the N-type doped region has a third thickness, and the first thickness, the second thickness, and the third thickness are all substantially equal.

15. The method for forming the semiconductor device structure as claimed in claim 9, further comprising:
   forming first doped regions in the first active region, wherein the first doped regions are located at two opposite sides of the P-type doped region; and
   forming second doped regions in the second active region, wherein the second doped regions are located at two opposite sides of the N-type doped region,
   the implantation process is further performed over the first doped regions and the second doped regions, and the metal silicide layer is further formed over the first doped regions and the second doped regions.

16. A method for forming a semiconductor device structure, comprising:
   providing a semiconductor substrate;
   forming an isolation structure in the semiconductor substrate, wherein the isolation structure surrounds a first active region and a second active region of the semiconductor substrate;
   forming a semiconductor strip structure over the semiconductor substrate, wherein the semiconductor strip structure extends across the first active region, the second active region, and the isolation structure between the first active region and the second active region, the semiconductor strip structure has a first doped region, a second doped region, and a spacing region between the first doped region and the second doped region, the first doped region extends across the first active region, the second doped region extends across the second active region, and the spacing region is over the isolation structure;
   performing an implantation process over the first doped region, the second doped region, and the spacing region; and
   forming a metal silicide layer over the first doped region, the second doped region, and the spacing region, wherein the metal silicide layer continuously covers the first doped region, the second doped region, and the spacing region.

17. The method for forming the semiconductor device structure as claimed in claim 16, wherein the spacing region is narrower than the isolation structure between the first active region and the second active region.

18. The method for forming the semiconductor device structure as claimed in claim 16, wherein the first doped region is partially over the isolation structure.

19. The method for forming the semiconductor device structure as claimed in claim 18, wherein the second doped region is partially over the isolation structure.

20. The method for forming the semiconductor device structure as claimed in claim 16, further comprising:
   forming third doped regions in the first active region, wherein the third doped regions are located at two opposite sides of the first doped region; and
   forming fourth doped regions in the second active region, wherein the fourth doped regions are located at two opposite sides of the second doped region,
   the implantation process is further performed over the third doped regions and the fourth doped regions, and the metal silicide layer is further formed over the third doped regions and the fourth doped regions.

\* \* \* \* \*